US011101379B2

(12) United States Patent
Romanczyk et al.

(10) Patent No.: US 11,101,379 B2
(45) Date of Patent: Aug. 24, 2021

(54) STRUCTURE FOR INCREASING MOBILITY IN A HIGH ELECTRON MOBILITY TRANSISTOR

(71) Applicant: The Regents of the University of California, Oakland, CA (US)

(72) Inventors: Brian Romanczyk, Santa Barbara, CA (US); Haoran Li, Goleta, CA (US); Elaheh Ahmadi, Hyattsville, MD (US); Steven Wienecke, Santa Barabara, CA (US); Matthew Guidry, Goleta, CA (US); Xun Zheng, Santa Barbara, CA (US); Stacia Keller, Santa Barbara, CA (US); Umesh K. Mishra, Montecito, CA (US)

(73) Assignee: THEREGENIS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 16/461,505

(22) PCT Filed: Nov. 16, 2017

(86) PCT No.: PCT/US2017/062014
§ 371 (c)(1),
(2) Date: May 16, 2019

(87) PCT Pub. No.: WO2018/094046
PCT Pub. Date: May 24, 2018

(65) Prior Publication Data
US 2019/0348532 A1 Nov. 14, 2019

Related U.S. Application Data
(60) Provisional application No. 62/423,101, filed on Nov. 16, 2016.

(51) Int. Cl.
*H01L 29/66* (2006.01)
*H01L 29/778* (2006.01)
(Continued)

(52) U.S. Cl.
CPC ...... *H01L 29/7786* (2013.01); *H01L 29/1029* (2013.01); *H01L 29/2003* (2013.01); *H01L 29/205* (2013.01); *H01L 29/66462* (2013.01)

(58) Field of Classification Search
CPC ............ H01L 29/1029; H01L 29/2003; H01L 29/66431; H01L 29/66462; H01L 29/778; H01L 29/7786; H01L 29/7789
See application file for complete search history.

(56) References Cited

U.S. PATENT DOCUMENTS 6,727,531 B1 4/2004 Redwing et al.
2006/0197109 A1 9/2006 Saxler
(Continued)

OTHER PUBLICATIONS

PCT International Search Report & Written Opinion dated Feb. 6, 2018, Application No. PCT/US17/62014.
(Continued)

*Primary Examiner* — Hoai V Pham
(74) *Attorney, Agent, or Firm* — Gates & Cooper LLP

(57) ABSTRACT

A novel design for a nitrogen polar high-electron-mobility transistor (HEMT) structure comprising a GaN/InGaN composite channel. As A novel design for a nitrogen polar high-electron-mobility transistor (HEMT) structure comprising a GaN/InGaN composite channel. As illustrated herein, a thin InGaN layer introduced in the channel increases the carrier density, reduces the electric field in the channel, and increases the carrier mobility. The dependence of p on InGaN thickness ($^t$InGaN) and indium composition ($^x$In) was investigated for different channel thicknesses. With optimized $^t$InGaN and $^x$In, significant improvements in electron mobility were observed. For a 6 nm channel HEMT,
(Continued)

the electron mobility increased from 606 to 1141 $cm^2/(V \cdot s)$ when the 6 nm thick pure GaN channel was replaced by the 4 nm GaN/2 nm $In_{0.1}Ga_{0.9}N$ composite channel.

23 Claims, 36 Drawing Sheets

(51) Int. Cl.
*H01L 29/10* (2006.01)
*H01L 29/20* (2006.01)
*H01L 29/205* (2006.01)

(56) References Cited

U.S. PATENT DOCUMENTS

| | | |
|---|---|---|
| 2013/0207078 A1 | 8/2013 | Laboutin et al. |
| 2014/0175515 A1 | 6/2014 | Then et al. |
| 2015/0102387 A1 | 4/2015 | Shih et al. |

OTHER PUBLICATIONS

Wienecke et al. N-Polar deep recess MISHEMTs with record 2.9 W/mm at 94 GHz. IEEE Electron device letters, vol. 37, No. 6, Jun. 6, 2016. pp. 713-716. [retrieved on Jan. 14, 2018]. Retrieved from the internet: <URL: http://ieeexplore.ieee.org/document/7458796/>.

Zheng et al. N-Polar GaN MIS-HEMTs on Sapphire With High Combination of Power Gain Cutoff Frequency and Three-Terminal Breakdown Voltage. IEEE Electron Device Letters, 37, Issue 1, Jan. 1, 2016. pp. 77-80 [retrieved on Jan. 12, 2018]. Retrieved from the internet: < U Rl: http ://i eeexplore. ieee .org/ document/73327 48/>.

FIG. 2A
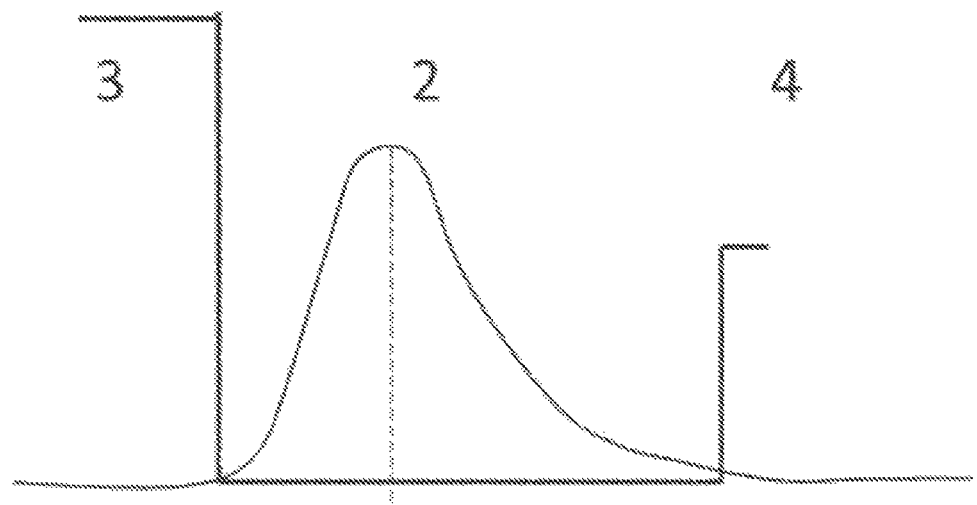
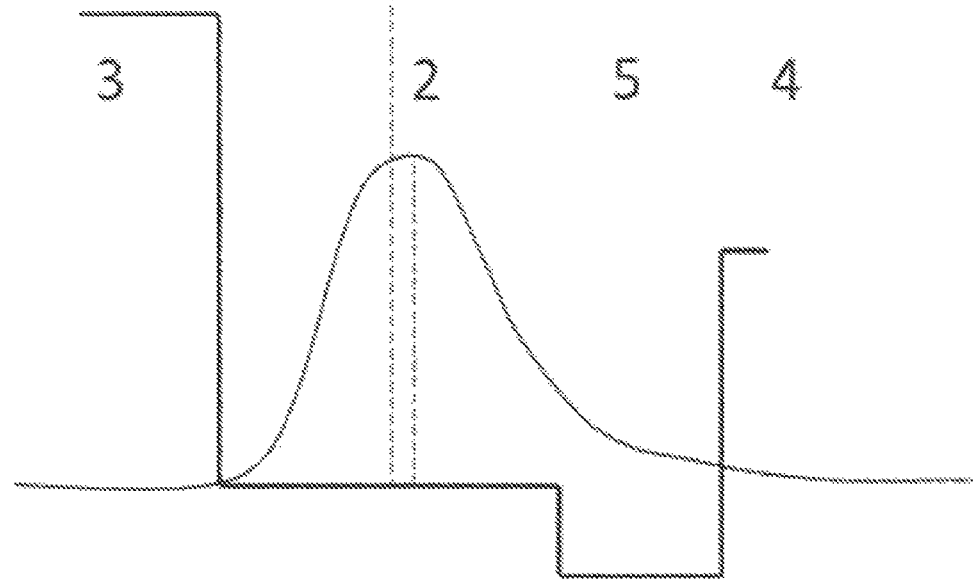
FIG. 2B

Higher Gain Desired in this region

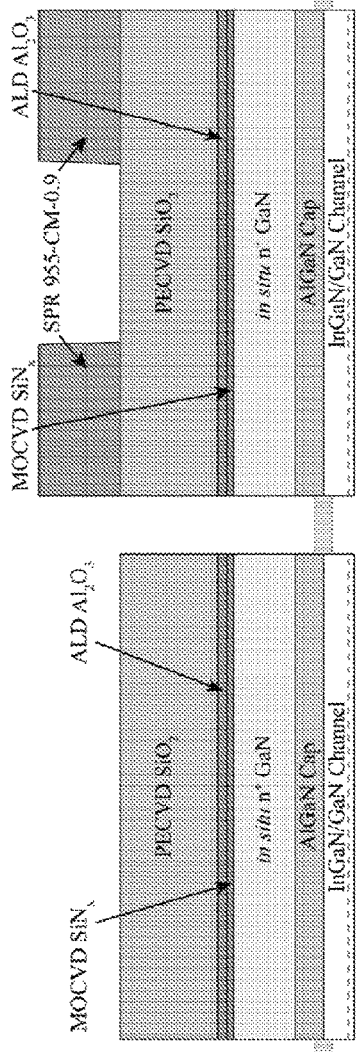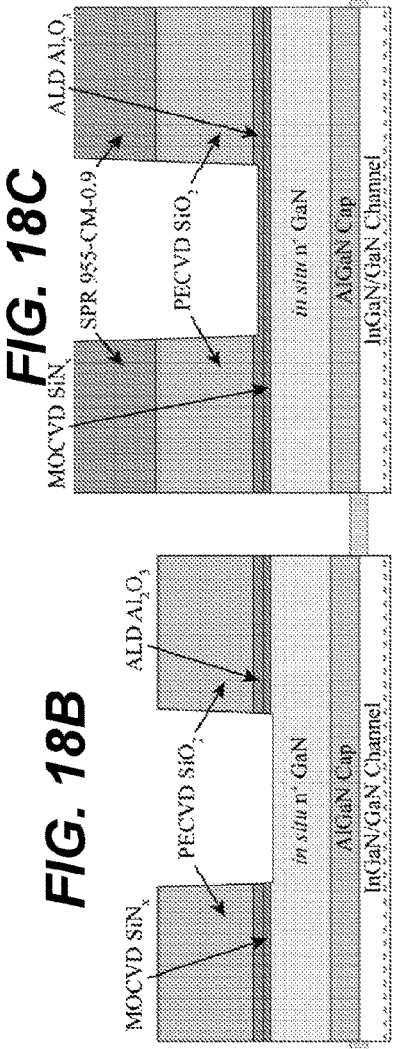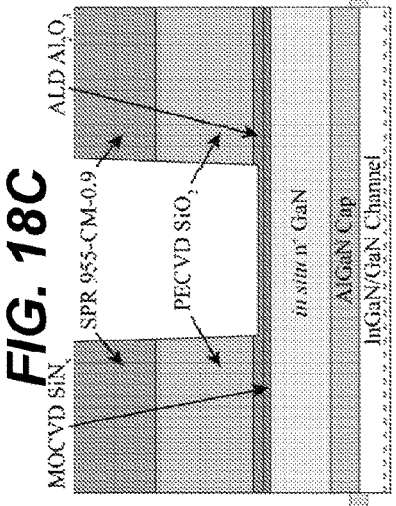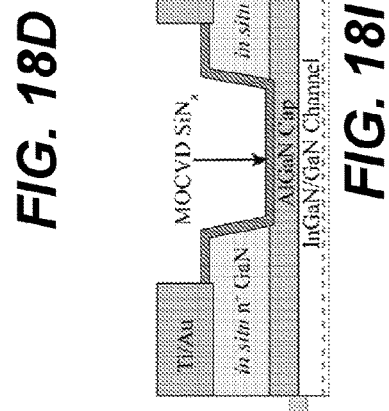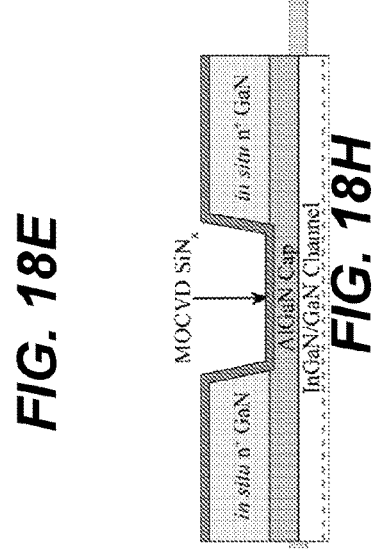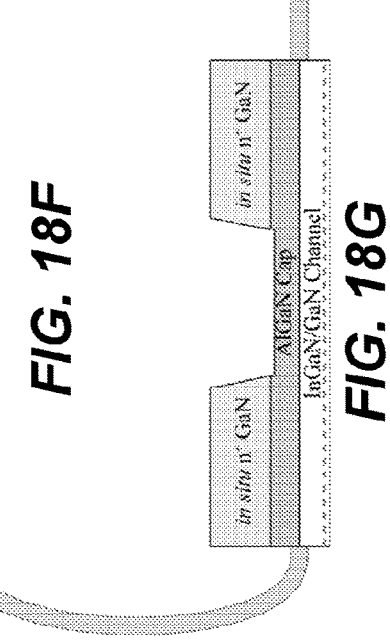
FIG. 18A  FIG. 18B  FIG. 18C  FIG. 18D  FIG. 18E  FIG. 18F  FIG. 18G  FIG. 18H  FIG. 18I

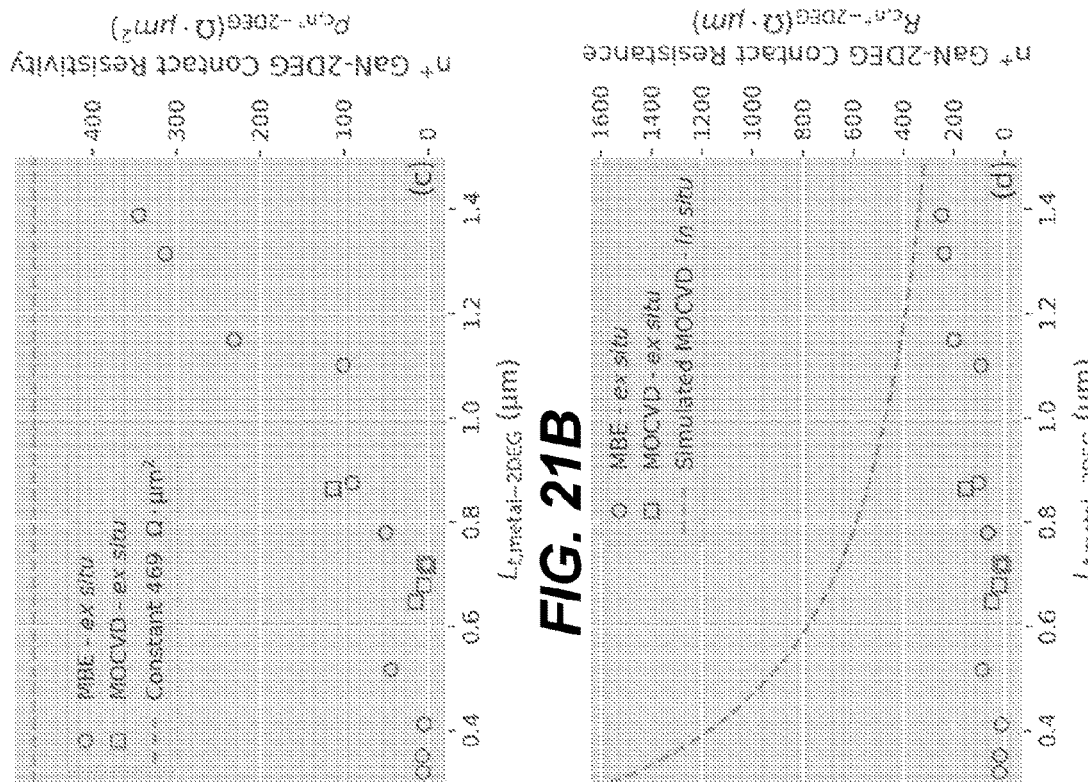
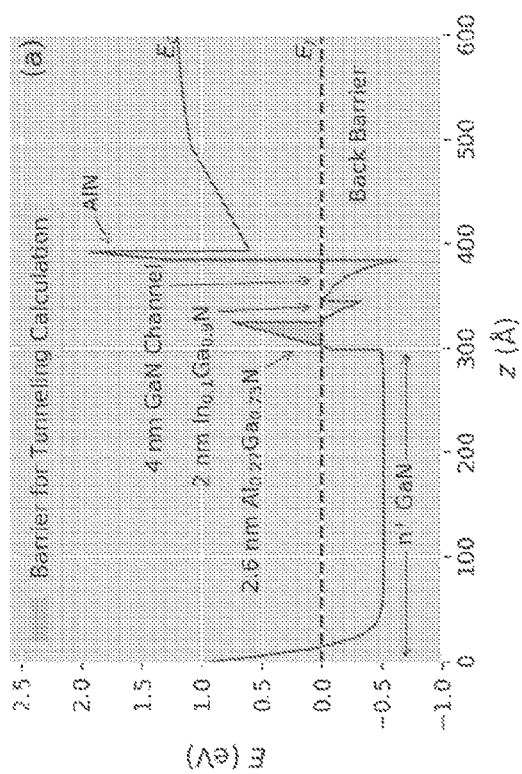
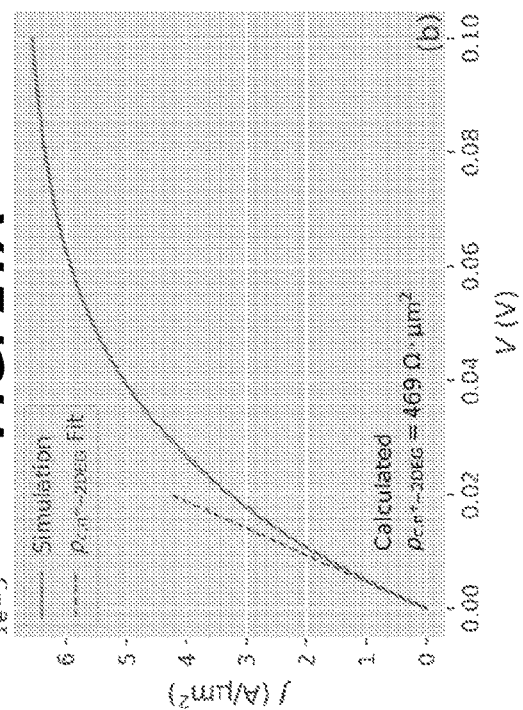
FIG. 21A  FIG. 21B  FIG. 21C  FIG. 21D

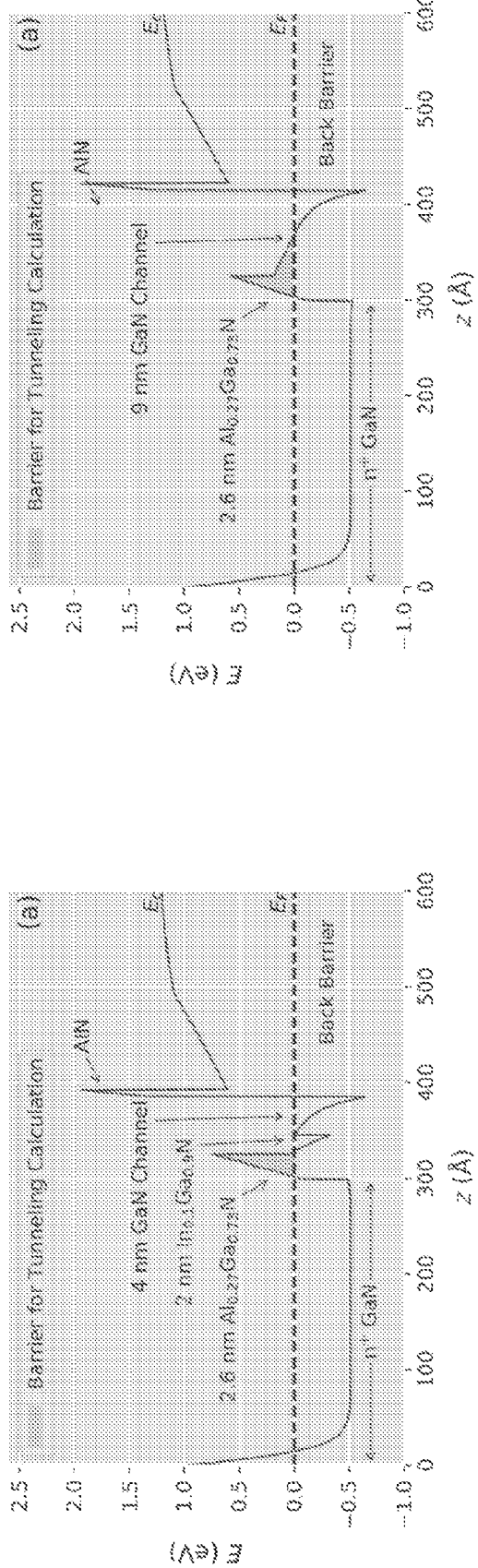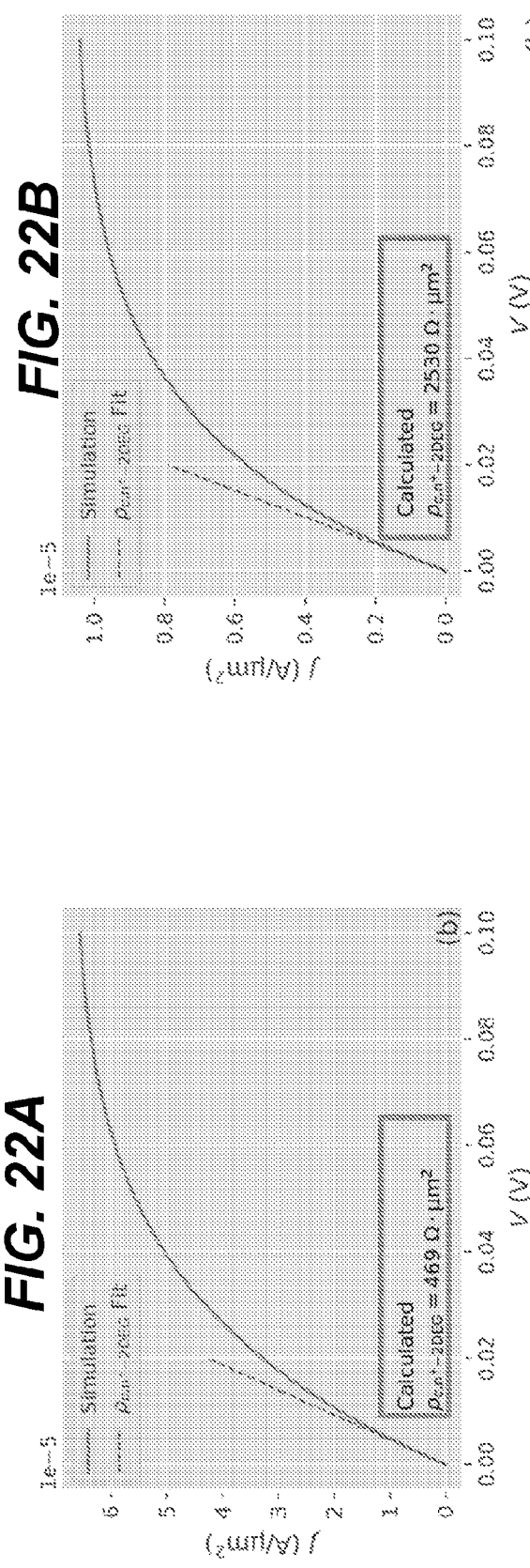
FIG. 22A
FIG. 22B
FIG. 22C
FIG. 22D

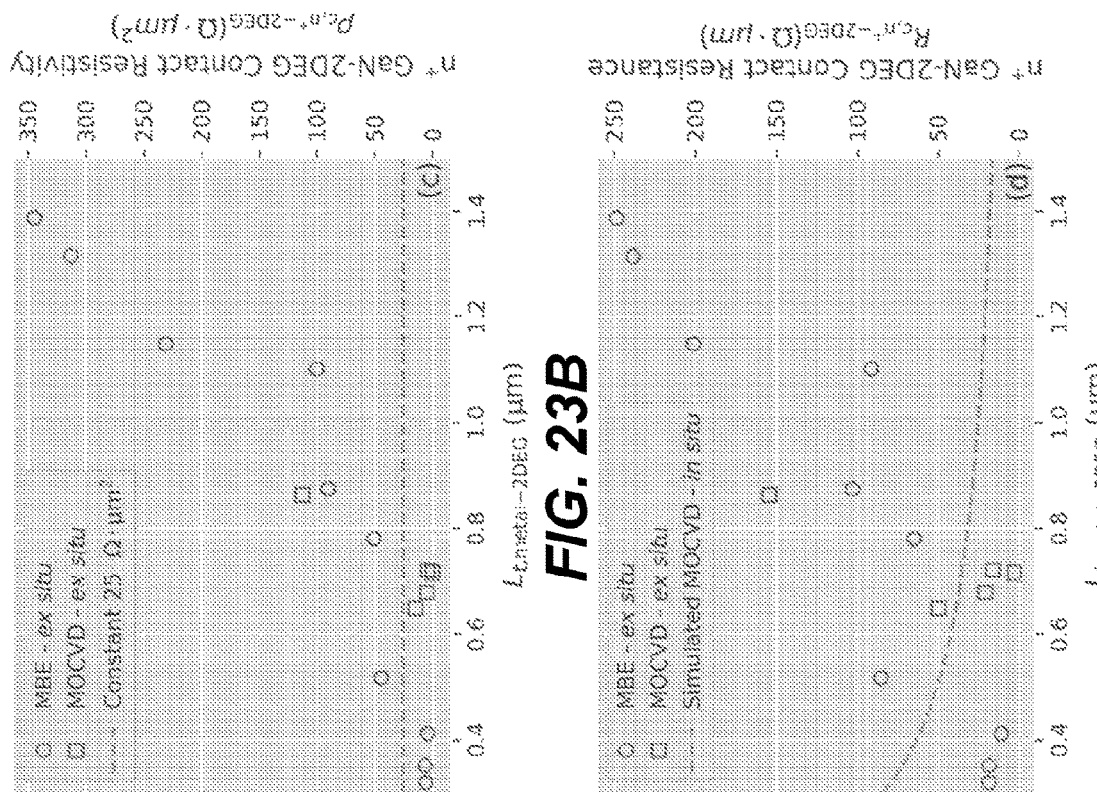
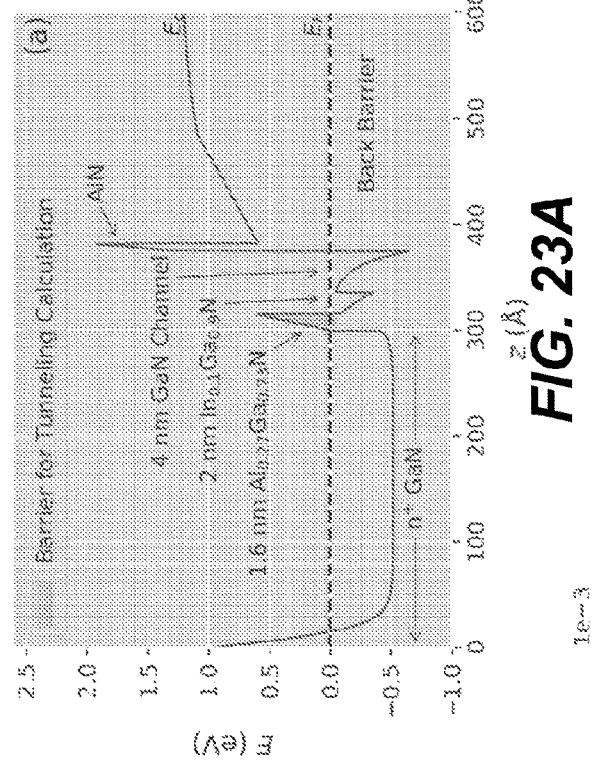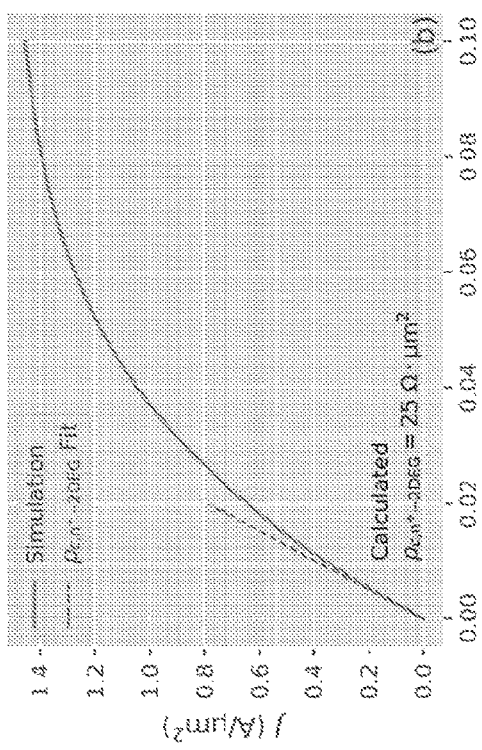
FIG. 23A  FIG. 23B  FIG. 23C  FIG. 23D

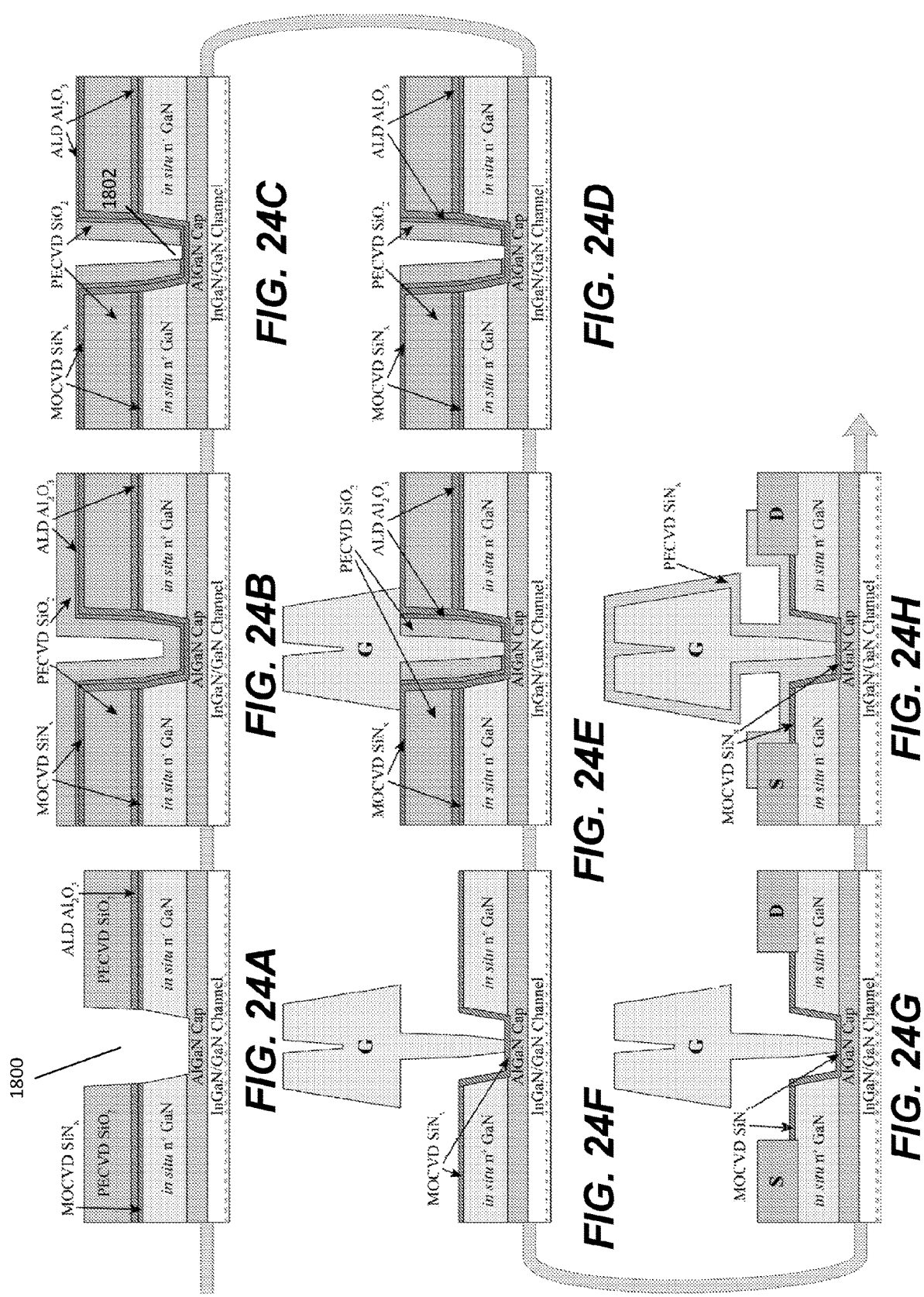

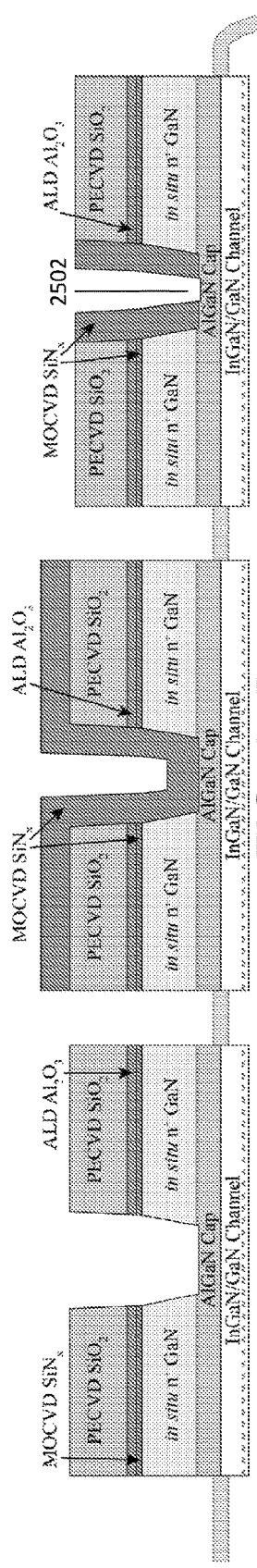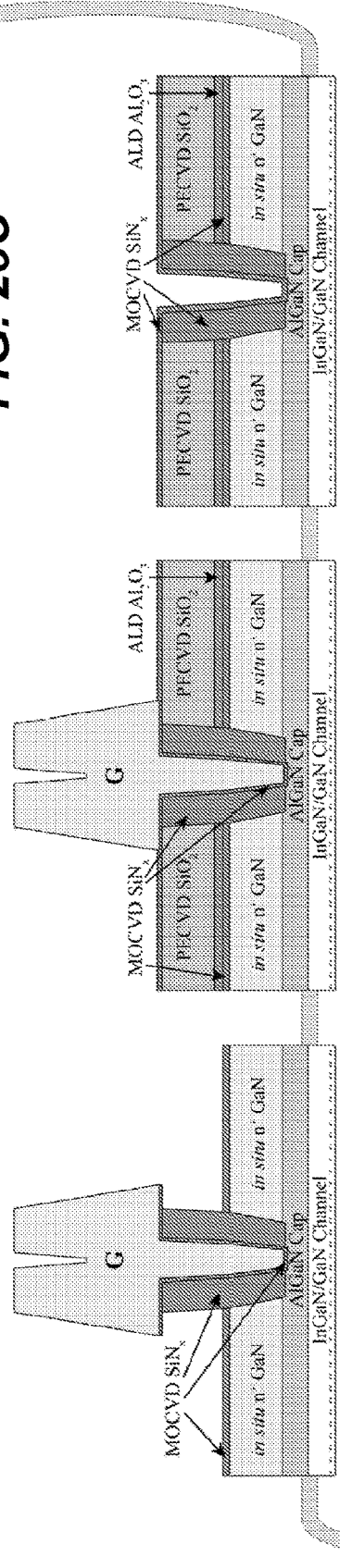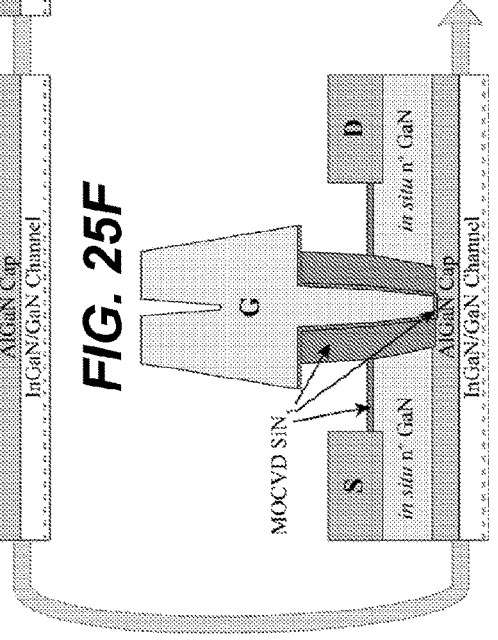

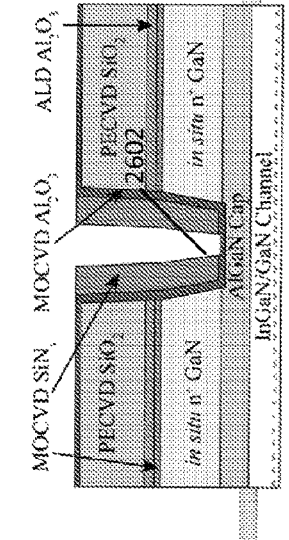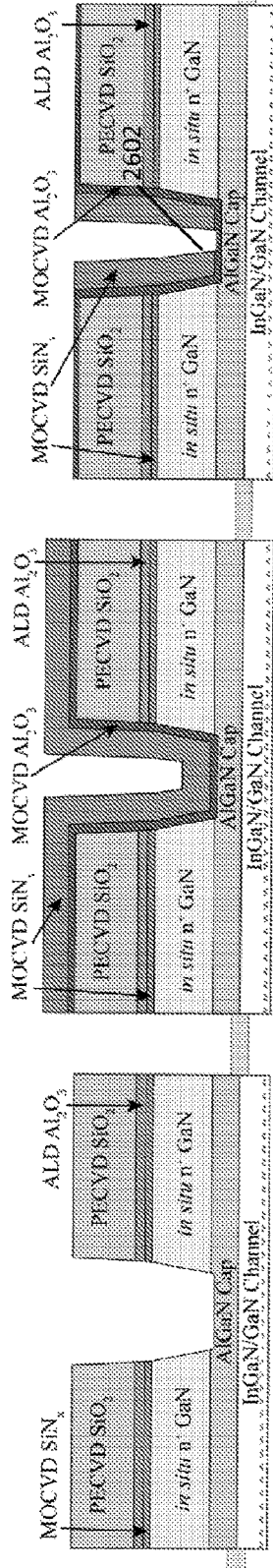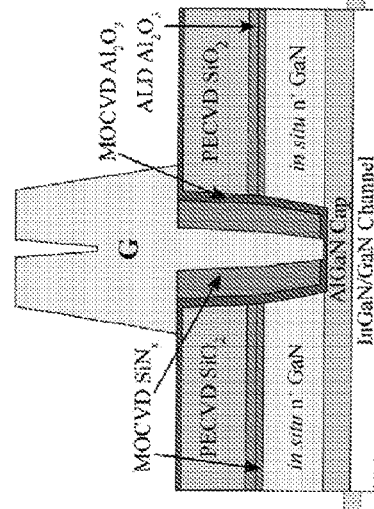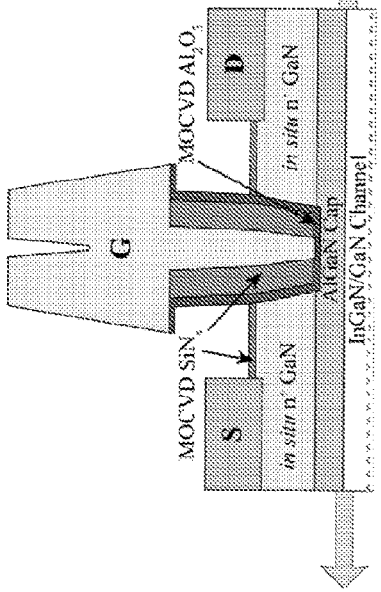
FIG. 26A  FIG. 26B  FIG. 26C
FIG. 26F  FIG. 26E  FIG. 26D

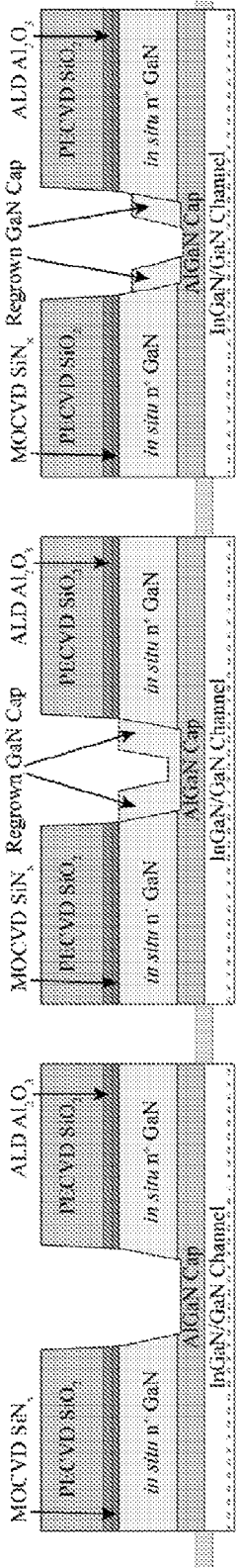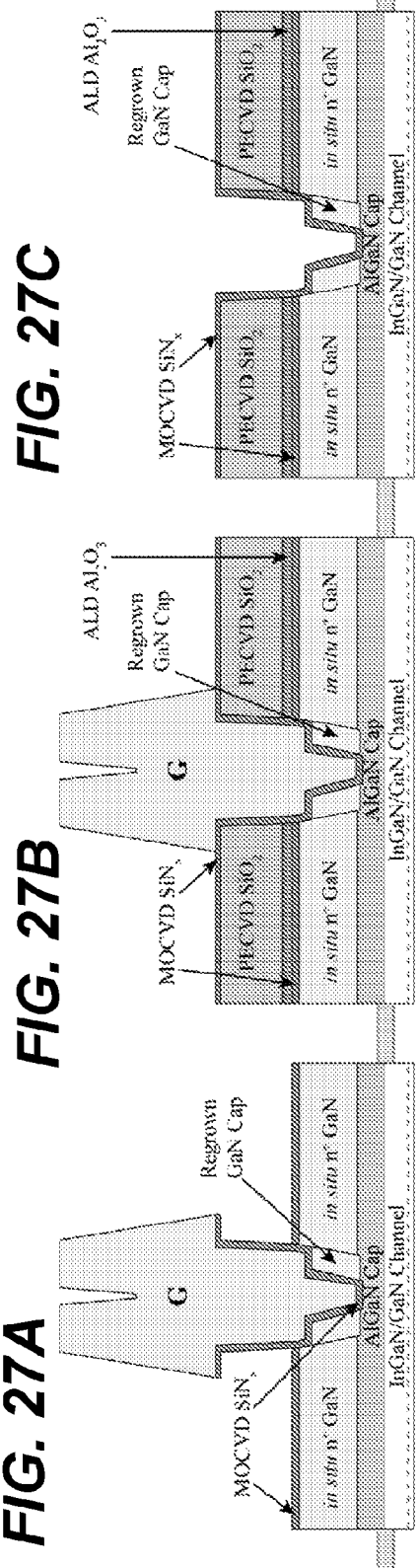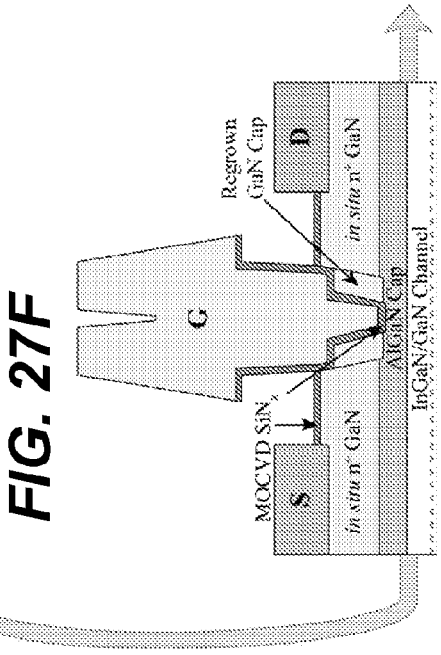
FIG. 27A  FIG. 27B  FIG. 27C
FIG. 27D  FIG. 27E  FIG. 27F
FIG. 27G

STRUCTURE FOR INCREASING MOBILITY IN A HIGH ELECTRON MOBILITY TRANSISTOR

CROSS REFERENCE TO RELATED APPLICATIONS

This application claims the benefit under 35 U.S.C. Section 119(e) of co-pending and commonly assigned U.S. Provisional Patent Application No. 62/423,101, filed Nov. 16, 2016, by Brian Romanczyk, Haoran Li, Elaheh Ahmadi, Steven Wienecke, Matthew Guidry, Xun Zheng, Stacia Keller, and Umesh K. Mishra, entitled "STRUCTURE FOR INCREASING MOBILITY IN A HIGH ELECTRON MOBILITY TRANSISTOR,", which application is incorporated by reference herein.

STATEMENT REGARDING FEDERALLY SPONSORED RESEARCH AND DEVELOPMENT

This invention was made with Government support under Grant No. N-00014-16-1-2931, awarded by the U.S. Office of Naval Research. The Government has certain rights in this invention.

BACKGROUND OF THE INVENTION

1. Field of the Invention

This invention relates to High Electron Mobility Transistors (HEMTs)

2. Description of the Related Art (Note: This application references a number of different publications as indicated throughout the specification by one or more reference numbers in superscripts, e.g., [x]. A list of these different publications ordered according to these reference numbers can be found below in the section entitled "References." Each of these publications is incorporated by reference herein.) High-electron mobility transistors (HEMTs) are solid-state electron devices made from a semiconductor heterostructure that are widely used to amplify high-frequency signals. They operate by biasing a gate electrode to modulate a sheet of electrons ($n_s$) in the form of a two-dimensional electron gas (2DEG) which is confined to a layer in the heterostructure referred to as a channel.

GaN based HEMTs have great capacity in high-power, high-frequency applications due to their wide band gap and the reasonably high density and high mobility of the 2DEGs formed at the (Al,Ga,In)N/GaN hetero-interface.[1,2] While the majority of today's III-N transistors are based on metal-polar heterostructures grown in the typical (0001) or c-direction, N-polar (000$\bar{1}$) materials have gained attention following the breakthrough in the deposition of high quality (000$\bar{1}$) films.[3] Compared to their Ga-polar counterparts, N-polar HEMT structures improve the scalability of devices, increase the electron confinement and reduce contact resistance.[4-7] Recently, N-polar AlGaN/GaN HEMTs with an outstanding output power density ($P_{out}$) of 6.7 W/mm at 94 GHz with an associated power-added efficiency (PAE) of 14.4% were demonstrated.[8] A record PAE of 27.8% with a high $P_{out}$ of 3 W/mm at 94 GHz was also reported.[9] Additionally, devices with high power gain cutoff frequency ($f_{max}$) of 248 GHz together with a high breakdown voltage of 114 V were presented by Zheng et al.[10]

It is desirable to maximize mobility, increase breakdown voltage, and improve frequency performance. One or more embodiments of the present invention satisfy these needs.

SUMMARY OF THE INVENTION

The present disclosure describes a novel channel structure for semiconductor high-electron-mobility transistors (HEMT). In one or more examples, the channel structure is engineered to increase electron mobility. Electron mobility is a key material parameter which is required for high power and high frequency HEMT performance.

In one or more embodiments, a novel Nitrogen-polar (N-polar) HEMT structure comprises a GaN/InGaN composite channel maintaining high 2DEG mobility when scaling down the channel thickness. By placing a thin InGaN layer between the channel and an AlGaN cap, the electric field in the channel decreases and the distance between the centroid of the 2DEG and the AlN/GaN interface increases, suppressing the scattering at the interface and significantly improving the electron mobility. The sheet charge density also increases due to the net positive polarization charge at the GaN/InGaN interface. In one or more examples, a mobility (u) increase of 73% was observed when a 6 nm thick pure GaN channel was replaced by a 4 nm GaN/2 nm $In_{0.1}Ga_{0.9}N$ composite channel in the HEMT structure. In another example, a sample fabricated with 3 nm GaN/1 nm $In_{0.1}Ga_{0.9}N$ composite channel exhibited higher p as compared to the sample with a 8 nm thick pure GaN channel, reducing the smallest applicable channel thickness by half. This design was also proven to significantly improve the channel scalability as measured by Hall measurements, and thus has the potential to improve the lateral scalability of N-polar III-N HEMT devices.

In one or more further embodiments, the device structure comprises an N-Polar Deep-Recess (NPDR) metal-insulator-semiconductor high electron mobility transistor (MISH-EMT) optimized by lowering the electric field in the GaN channel via insertion of a thin InGaN layer. The inserted InGaN layer leads to an increase in both the sheet charge and mobility of the 2DEG, facilitating further vertical and lateral scaling of the transistors. Moreover, the insertion of an InGaN layer results in a stronger reverse electric field in the AlGaN cap layer under the gate enabling higher break down voltages. Furthermore, in the access regions, the insertion of an InGaN layer between the GaN channel and AlGaN cap removes the secondary 2DEG seen at the AlGaN cap/GaN cap interface in previous NPDR MISHEMTs. The device structure enables improved device performance for operation in the W-band (e.g., 75-110 GHz, e.g., at 94 GHz).

One or more embodiments of the present invention disclose a device structure for a field effect transistor (FET) device, comprising a channel layer comprising a first material on a second material, wherein (1) the second material has a lower conduction band energy relative to the first material, or (2) the first and second materials comprise polar materials and a polarization of the second material provides a net positive polarization charge at an interface between the first material and the second material, or (3) the second material has a lower conduction band energy relative to the first material, the first and second materials comprise polar materials, and a polarization of the second material provides a net positive polarization charge at an interface between the first material and the second material; and a first barrier layer on the channel layer and comprising a higher conduction band energy as compared to the first material.

To better illustrate the composition of matter and methods described herein, a non-limiting list of examples is provided here:

In Example 1, the first material comprises gallium nitride and the second material comprises III-Nitride including indium and gallium; and the first barrier layer comprises a III-Nitride barrier layer including aluminum.

In Example 2, the device further comprises a second barrier layer (e.g., comprising aluminum), wherein the channel layer is between the first barrier layer and the second barrier layer, and the second barrier layer comprises III-nitride having a higher conduction band energy as compared to the gallium nitride.

In Example 3, the device of one or any of the previous examples includes the gallium nitride that is a layer having a thickness in a range of 1-20 nm and the second material that is a layer having a thickness in a range of 1-20 nm and an indium composition in a range of 5%-20%.

In Example 4, the device of one or any combination of the previous examples includes the channel layer having a thickness in a range of 8-15 nm, and the second material is an InGaN layer having a thickness in a range of 18%-25% of the channel layer thickness, and an indium composition in a range of 2%-8%.

In Example 4, the device of one or any combination of previous examples includes the channel layer has a thickness in a range of 2-8 nm, and the second material is an InGaN layer having a thickness in a range of 18%-25% of the channel layer thickness, and an indium composition in a range of 9%-20%.

In Example 5, the device of one or any combination of previous examples includes
the channel layer, the first material, and the second material each having a thickness, and the second material comprising InGaN having an indium composition, such that the device has a mobility increased by a factor of at least two as compared to the device comprising a channel layer consisting essentially of gallium nitride.

In Example 6, the device of one or any combination of previous examples further includes a gate electrode; and a dielectric between the gate electrode and the channel layer, wherein the channel layer and the first barrier layer have an N-polar orientation and the channel layer comprises a two dimensional electron or hole gas confined in the first material by the first barrier layer.

In Example 7, the device of one or any combination of previous examples includes a III-nitride cap layer on or above the channel layer, wherein the cap layer is between the channel layer and the dielectric, and a recess in the cap layer, wherein the gate electrode is deposited in the recess and comprises a T-gate overhanging a portion of the dielectric without physically contacting the portion of the dielectric.

In Example 8, the device of one or any combination of previous examples includes an in situ $n^+$-type gallium nitride (GaN) layer on the cap layer outside the recess, wherein the in situ $n^+$-type GaN layer is grown in situ with the barrier layer, and the channel layer, and the cap layer comprises AlGaN; a source contact and a drain contact to the in situ $n^+$-type GaN layer; and wherein: the dielectric in the recess includes one or more layers grown by plasma enhanced chemical vapor deposition (PECVD), metal organic chemical vapor deposition (MOCVD), or atomic layer deposition (ALD), and at least a portion of the dielectric outside the recess is removed and the dielectric aligns the T-gate in the recess.

The present disclosure further describes a device structure for a high hole mobility transistor, comprising a barrier layer with a higher bandgap compared to a channel layers on top of the higher bandgap barrier layer, wherein the bandgap of the channel layer adjacent to the barrier layer is higher compared to a part of the channel layer away from the barrier layer with both parts of the channel layer having a bandgap less than the bandgap of the barrier layer.

The present disclosure further describes methods for fabricating the devices disclosed herein

BRIEF DESCRIPTION OF THE DRAWINGS

Referring now to the drawings in which like reference numbers represent corresponding parts throughout:

FIG. 2A illustrates the conduction band electron energy profile of a traditional HEMT structure considering only conduction band energies of given layers. The position of the 2DEG is indicated by the dashed line and is closer to the material 2/3 interface than the 2/4 interface. FIG. 2B illustrates the band diagram for the device with insertion of material 5 having a lower conduction band energy, according to one or more embodiments of the present invention, showing the position of the 2DEG is displaced away from the material 2/3 interface. The numbers 2, 3, 4, and 5 in FIGS. 2A and 2B refer to Material 2, Material 3, Material 4, and Material 5, respectively.

FIGS. 18A-18I illustrate a process flow for (transfer-length measurements) TLM structures using a GaN over AlGaN selective etch, according to one or more embodiments of the invention.

FIGS. 21A-21D show measurements and calculations for the ohmic contact region of the structure of FIG. 19A with a channel comprising 2 nm thick InGaN on 4 nm thick GaN, plotting simulated energy as a function of distance through the structure (FIG. 21A), comparison of calculated $\rho_{c,\ n+\text{-}2DEG}$ ($\Omega \cdot \mu m^2$) as a function of transfer length extracted from TLM ($L_{t,\ metal\text{-}2DEG}$, in micrometers) with previously yielded results with ex situ regrown $n^+$ GaN contacts by Molecular Beam Epitaxy (MBE) or MOCVD (FIG. 21B), calculated current density as a function of applied voltage (FIG. 21C), and comparison of $n^+$ GaN-2DEG contact resistance ($R_{c,\ n+\text{-}2DEG}$) ($\Omega \cdot \mu m$) as a function of $L_{t,\ metal\text{-}2DEG}$ with previously yielded results with ex situ regrown $n^+$ GaN contacts by MBE or MOCVD (FIG. 21D), showing the calculated results close to the regrown contact results.

FIGS. 22A-22D compare the energy band diagram and current density for the ohmic contact region of the structure of FIG. 19A with a composite channel (2 nm thick InGaN and 4 nm thick GaN) with the structure of FIG. 19A with a 9 nm GaN channel, plotting energy as a function of distance through the structure with the composite channel (FIG. 22A), energy as a function of distance through the structure with the 9 nm thick GaN channel (FIG. 22B), current density as a function of applied voltage for the device of FIG. 19A with composite channel (FIG. 22C), and current density as a function of applied voltage for the device of FIG. 19A with the 9 nm GaN channel (FIG. 22D), showing significantly lower $\rho_{c,\ n+\text{-}2DEG}$ ($\Omega \cdot \mu m^2$) for the 2 nm/4 nm InGaN/GaN composite channel device as compared to the 9 nm GaN channel device.

FIGS. 23A-23D show the energy and current density for the ohmic contact region of the structure of FIG. 19A with a composite channel (2 nm thick InGaN and 4 nm thick GaN) and an 1.6 nm thick AlGaN cap, plotting simulated energy as a function of distance through the structure (FIG. 23A), comparison of calculated $\rho_{c,\ n+\text{-}2DEG}$ ($\Omega \cdot \mu m^2$) as a function of $L_{t,\ metal\text{-}2DEG}$ (in micrometers) with previously yielded results with ex situ regrown n$^+$ GaN contacts by MBE or MOCVD (FIG. 23B), calculated current density as a function of applied voltage (FIG. 23C), and comparison of $R_{c,\ n+\text{-}2DEG}$ ($\Omega \cdot \mu m$) as a function of $L_{t,\ metal\text{-}2DEG}$ with previously yielded results with ex situ regrown n$^+$ GaN contacts by MBE or MOCVD (FIG. 23D), showing results competitive with the best regrown contact results.

FIGS. 24A-24H illustrate a process flow continuing from after the step of FIG. 18F, according to one or more embodiments of the invention.

FIGS. 25A-25G illustrate another process flow continuing from after the step of FIG. 18F, according to one or more embodiments of the invention.

FIGS. 26A-26F illustrate yet another process flow continuing from after the step of FIG. 18F, according to one or more embodiments of the invention.

FIGS. 27A-27G illustrate yet a further process flow continuing from after the step of FIG. 18F, according to one or more embodiments of the invention.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Figures 1A, 1B, 1C:
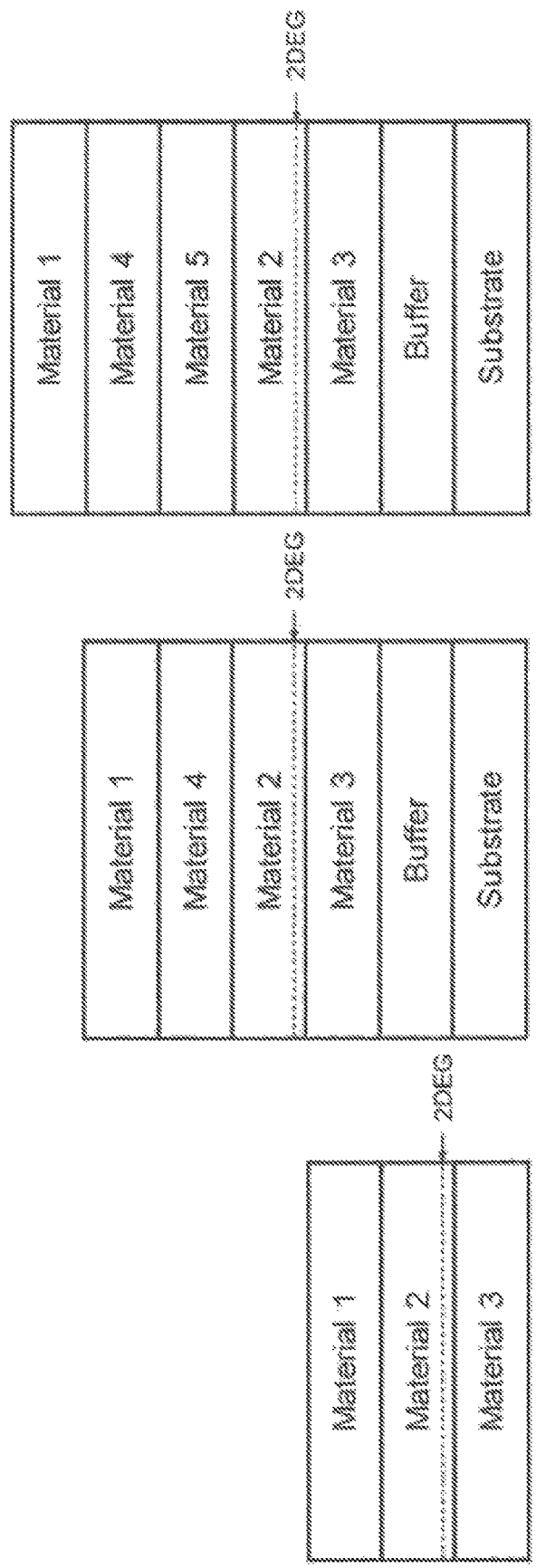
FIG. 1A illustrates minimum layers required for a HEMT.
FIG. 1B illustrates a traditional HEMT structure with optional layers.
FIG. 1C illustrates a layer structure for a HEMT according to one or more embodiments of the present invention.

FIG. 1A illustrates a HEMT structure comprising a gate electrode comprised of a conductive material (Material 1), a channel layer where the two dimensional electron gas (2DEG) is primarily located (Material 2), and a primary barrier layer adjacent to the channel layer which is made of Material 3 with a higher conduction band energy as compared to the Material 2 of the channel layer, such that the 2DEG forms in, and is confined to, the channel layer at the interface between Material 2 and Material 3. As shown in FIG. 1A, Material 2 is between Material 1 and Material 3.

FIG. 1B illustrates an example with additional layers included in the HEMT structure, comprising a substrate 100 upon which the heterostructure material deposition is initiated, a buffer layer 102, which may be comprised of multiple materials, to allow the transition from the substrate's 100 material to the device material (e.g., Material 3). In the case where the substrate 100 and device layers are the same, this buffer layer 102 may not be present.

FIG. 1B further illustrates a second barrier layer on the other side of the channel as the primary barrier layer (Material 3). This second barrier layer is comprised of Material 4 having a higher conduction band energy as compared to the channel material (Material 2).

In practice, Materials 3 and 4 need not be made of a single material. They may consist of multiple discreet layers or be arbitrarily graded between different chemical compositions throughout the thickness. Material 3 and 4's only constraint is that a component of each material directly adjacent to Material 2 has a higher conduction band energy.

In the structure of FIG. 1B, the 2DEG also forms in Material 2 adjacent to the interface between Materials 2 and 3. The close proximity of the 2DEG to Material 3 results in scattering and reduces the electron mobility.

Figure 3A:
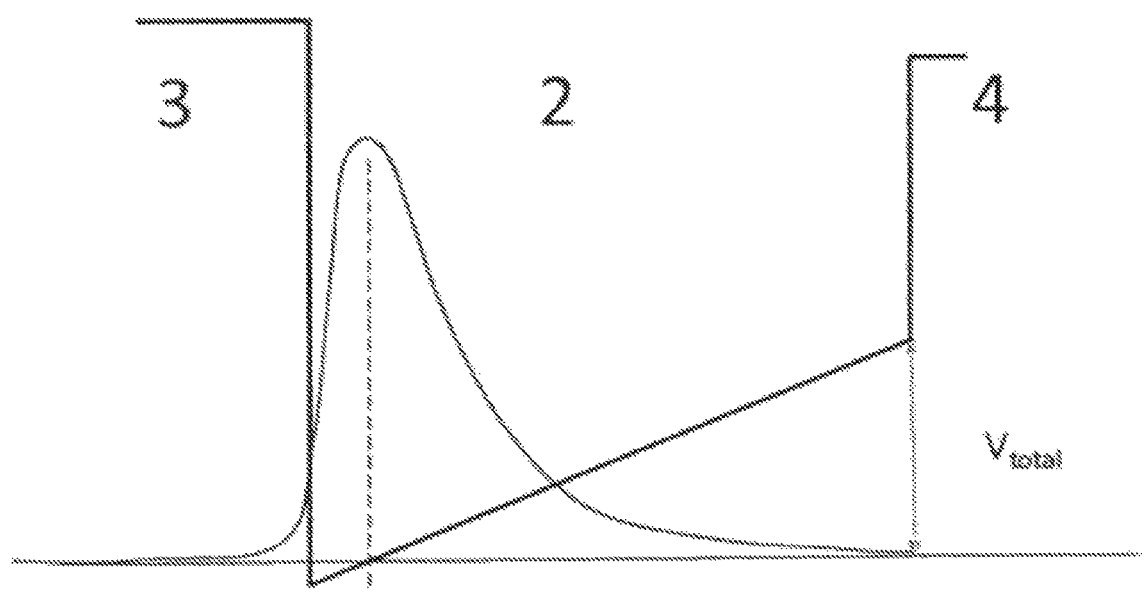
FIG. 3A illustrates conduction band electron energy profile of a traditional HEMT structure. The position of the 2DEG is indicated by the dashed line and is closer to the material 2/3 interface than the 2/4 interface. The voltage held in the channel is indicated by $V_{total}$.
Figure 3B:
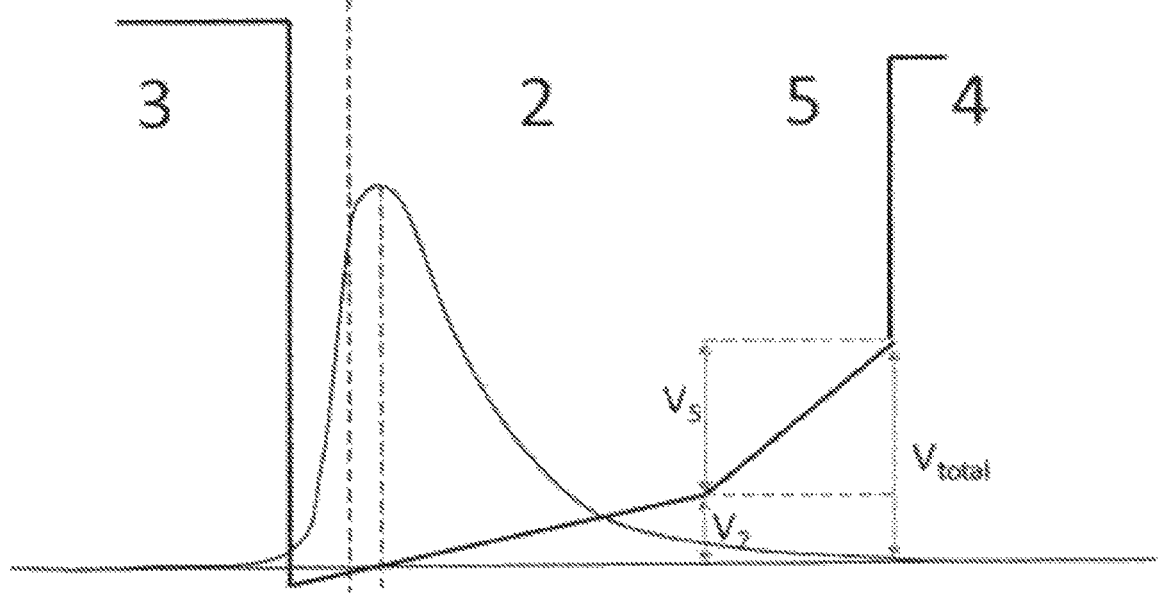
FIG. 3B illustrates the band diagram with the insertion of material 5 according to one or more embodiments of the present invention, wherein the material 5 provides a net positive charge at the material 2/5 interface, the portion of $V_{total}$ held in material 2 ($V_2$) is reduced resulting in a lower electric field in material 2, and the position of the 2DEG displaced away from the material 2/3 interface. The numbers 2, 3, 4, and 5 in FIGS. 3A and 3B refer to Material 2, Material 3, Material 4, and Material 5, respectively.

FIG. 1C illustrates an embodiment wherein the interface between Materials 2 and 3 is maintained but a portion of the remaining channel is replaced by Material 5. The addition of Material 5 displaces the 2DEG away from the Material 2/3 interface, increasing the mobility of the structure. Material 5 may be composed of a single material, or a stack of any number of discrete materials. Material 5 can possess one or both of the following properties to displace the 2DEG away from the Material 2.3 interface:

(1) a lower conduction band energy relative to Material 2.
(2) In polar materials, a polarization of Material 5 providing a net positive polarization charge at the Material 2/5 interface FIG. 2B illustrates property (1) operates based on quantum mechanical principles whereby inserting a layer with lower energy displaces the electron wavefunction towards that layer. FIG. 3B illustrates property (2) operates by modifying the potential profile of the channel by allowing a greater portion of the voltage drop in the channel to be held in Material 5, thereby reducing the voltage drop (and therefore the electric field) in Material 2. By having the magnitude of the channel electric field reduced in the region close to the Material 2/3 interface, the 2DEG is displaced away from the Material 2/3 interface resulting in increased mobility.

N-Polar Example a. Structures and Fabrication

In one example configuration, the structure of FIG. 1C is realized using N-polar (In, Al, Ga)N-based materials. These materials are advantageous due to their wide energy band gap and ability to generate a high electron sheet concentration $n_s$ with high electron mobility (μ) using polarization, and have been adopted in HEMT structures providing high output power density at high frequencies.

Figures 4A, 4B:
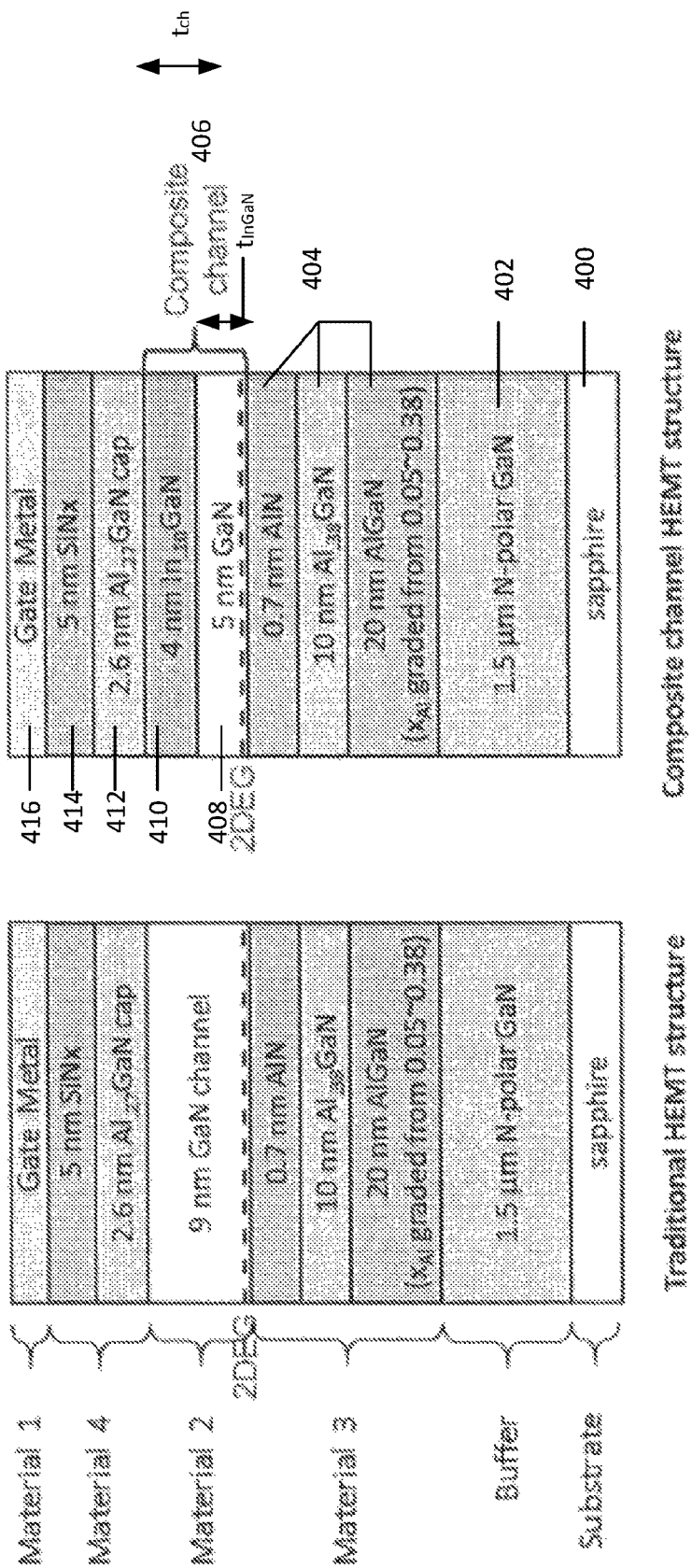
FIG. 4A illustrates a traditional N-polar device and FIG. 4B illustrates an InGaN/GaN composite channel HEMT structure according to one or more embodiments of the present invention.
Figures 5A, 5B:
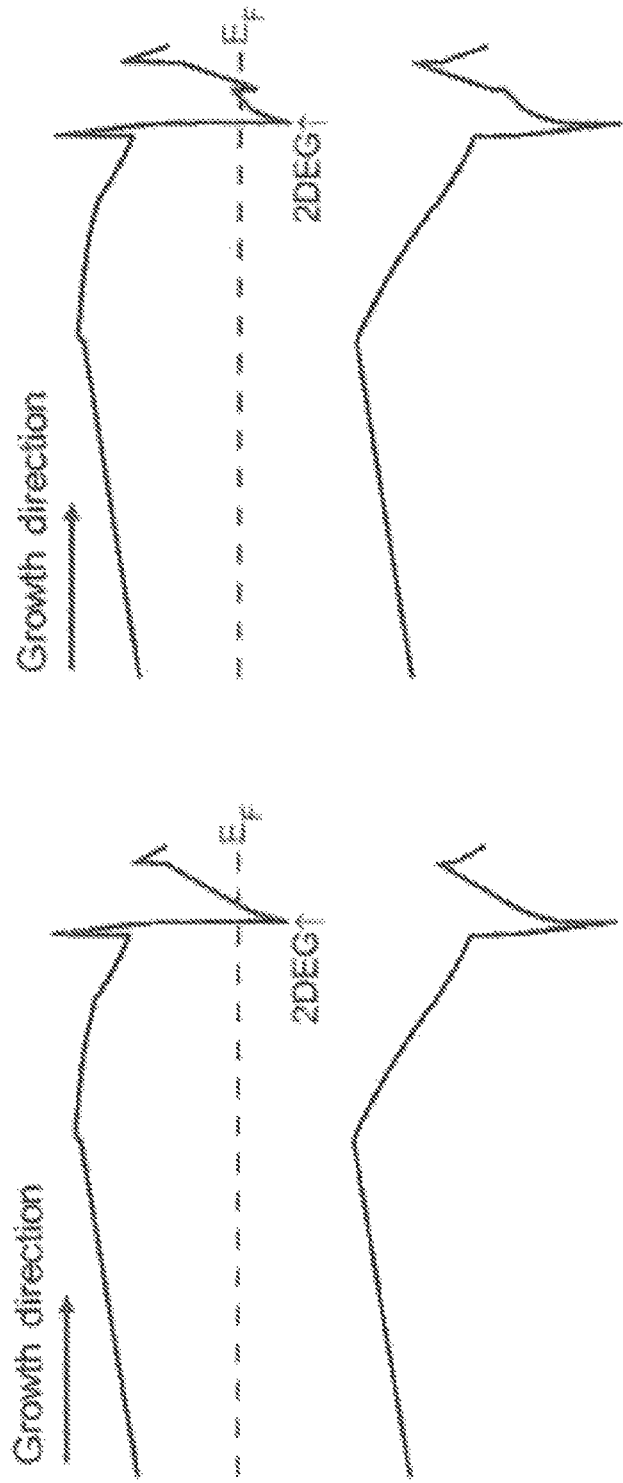
FIG. 5A illustrates the band diagram for the N-polar structure of FIG. 4A
FIG. 5B illustrates the band diagram for the InGaN/GaN composite channel HEMT structure of FIG. 4B. The position of the primary 2DEG is indicated.

FIG. 4A illustrates a cross-section of a traditional N-polar AlGaN/GaN HEMT structure and FIG. 5A shows the corresponding band diagram. The primary barrier (Material 3) consists of AlGaN and AlN while the channel (Material 2) is comprised only of GaN deposited on top of the AlN layer. The 2DEG forms in the GaN above this AlN/GaN interface at a distance $d_{2DEG}$ from the AlN. A barrier (Material 4) consisting of AlGaN and SiN is deposited above the channel. For device performance, it is desirable to reduce the channel thickness to improve the control the gate electrode has in modulating the 2DEG charge. However, with this structure, it has been experimentally observed that the mobility of the 2DEG rapidly degrades under two conditions where the 2DEG is displaced closer to the Material 2/3 interface: when the channel thickness is reduced (FIG. 6) and when increased negative bias is applied to the gate electrode.

FIG. 4B illustrates a new structure creating an InGaN/GaN composite channel HEMT structure where the upper portion of the GaN channel is replaced by Material 5, (e.g., InGaN, e.g., $In_{0.1}Ga_{0.9}N$).

The N-polar HEMT structures characterized in the next results section comprise a 1.5 μm thick semi-insulating (S.I.) GaN buffer, a 20 nm thick Si-doped graded $Al_xGa_{1-x}N$ ($x_{Al}$=0.05-0.38) back-barrier, a 10 nm thick unintentionally doped (UID) $Al_{0.38}Ga_{0.62}N$ back-barrier, a 0.7 nm thick AlN interlayer, a conventional GaN channel (FIG. 4A) or a composite GaN/InGaN channel (FIG. 4B), a 2.6 nm thick $Al_{0.27}Ga_{0.73}N$ cap and a 5 nm thick in-situ $SiN_x$ layer for surface protection. To understand the impact of InGaN thickness ($t_{InGaN}$) and indium composition ($x_{In}$) on the HEMT structures, five series of samples with different channel structures were investigated [Table 1] ($t_{ch}$ is channel thickness). For series-1, 2, 3, the structure parameters were $x_{In}$=0.1 and $t_{ch}$=9 nm, 6 nm and 4 nm, respectively, with varying $t_{InGaN}<t_{ch}$ and GaN thickness $t_{GaN}=t_{ch}-t_{InGaN}$. For series-4, the channel consisted of a 6 nm thick GaN layer and a 3 nm thick $In_xGa_{1-x}N$ layer with $x_{In}$=0.08, 0.11 and 0.15. For series-5, the channel consisted of a 4 nm thick GaN layer and a 2 nm thick $In_xGa_{1-x}N$ layer with $x_{In}$=0.05, 0.10 and 0.15.

The InGaN layer in the channel provides both of the desired properties of Material 5, in that it has a lower conduction band energy and provides a net negative polarization charge at the GaN/InGaN interface. The band diagram for the structure of FIG. 4B is shown in FIG. 5B.

TABLE 1

Indium thicknesses, channel thicknesses, GaN thicknesses, and $In_xGa_{1-x}N$ thicknesses for the investigated five series of N-polar HEMT structures.

| Series # | $x_{In}$ | $t_{ch}$ (nm) | $t_{InGaN}$ (nm) | $t_{GaN}$ (nm) |
|---|---|---|---|---|
| 1 | 0.1 | 9 | 0-9 | 9-0 |
| 2 | 0.1 | 6 | 0-3 | 6-3 |
| 3 | 0.1 | 4 | 1 | 3 |
| 4 | 0.08-0.15 | 9 | 3 | 6 |
| 5 | 0.05-0.15 | 6 | 2 | 4 |

All HEMT structures in the N-polar examples characterized in the next results section were deposited on c-plane sapphire substrates with 4° misorientation towards a-plane using metal-organic chemical vapor deposition (MOCVD).[14] Trimethylgallium (TMGa), trimethylaluminum (TMAl), trimethylindium (TMIn), ammonia ($NH_3$), disilane ($Si_2H_6$) and ferrocene ($Cp_2Fe$) were used as precursors. A 1.5 μm thick N-polar S.I. GaN base layer was first deposited on the sapphire substrate as reported previously.[15] Ferrocene was introduced to compensate the unintentionally incorporated oxygen impurities and obtain a semi-insulating layer. On top of the base layer, a 20 nm thick graded $Al_xGa_{1-x}N$ ($x_{Al}$=0.05-0.38) layer, followed by a 10 nm thick Al0.38Ga0.62N layer, was deposited. The TMGa and $NH_3$ flows ($f_{TMGa}$ and $fNH_3$) for the AlGaN layers were 11.7 μmol/min and 178 mmol/min, respectively. The TMAl flow ($f_{TMAl}$) varied from 0.8 to 9.2 μmol/min for the graded layer and was 9.2 μmol/min for the $Al_{0.38}Ga_{0.62}N$ layer. A disilane flow ($fSi_2H_6$) between 0.53 and 0.18 nmol/min was introduced into the graded AlGaN layer to achieve a doping level between $4\times10^{18}$ and $9\times10^{18}$ cm$^{-3}$, maintaining $n_s$ in HEMT structures with different $t_{ch}$. The AlGaN layers were grown at 1155° C. and 100 Torr.

Following the AlGaN layers, a 0.7 nm thick AlN interlayer was deposited with $f_{TMAl}$=11.0 μmol/min and a 0 to 9 nm thick GaN layer was grown with $f_{TMGa}$=9.6 μmol/min using the same $f_{NH3}$ as that for the AlGaN layers. Afterwards, the growth temperature was decreased to 915-955° C. and the reactor pressure increased to 500 Torr. A thin $In_xGa_{1-x}N$ ($x_{In}$=0.05-0.15) film with layer thickness varying from 0 to 9 nm was grown using $f_{TMIn}$=34.3 μmol/min, $f_{TMGa}$=9.6 μmol/min and $f_{NH3}$=178 mmol/min. On top of the $In_xGa_{1-x}N$ layer, a 2.6 nm thick $Al_{0.27}Ga_{0.73}N$ cap was deposited under the same growth condition with $f_{TMAl}$=2.5 μmol/min and $f_{TMGa}$=4.4 μmol/min. The structure was finished with a 5 nm thick in-situ $SiN_x$ film grown at 1030° C. and 500 Torr, with $f_{Si2H6}$=4.5 μmol/min and $f_{NH3}$=268 mmol/min.

b. Characterization Results for the N-Polar Example Structures Described in Section a.

The Al and In compositions of the AlGaN and InGaN films were determined by high resolution x-ray diffraction (XRD) with a Panalytical MRD PRO Materials Research Diffractometer. The sheet charge density and electron mobility of the 2DEG were measured by room temperature Van der Pauw Hall measurements. Note that the electron mobility determined in Hall effect measurements is lower than the electron mobility in an actual device where the gate is oriented such that the current flow occurs parallel to the surface steps originating from the crystal misorientation.[15,16]

Figure 6:
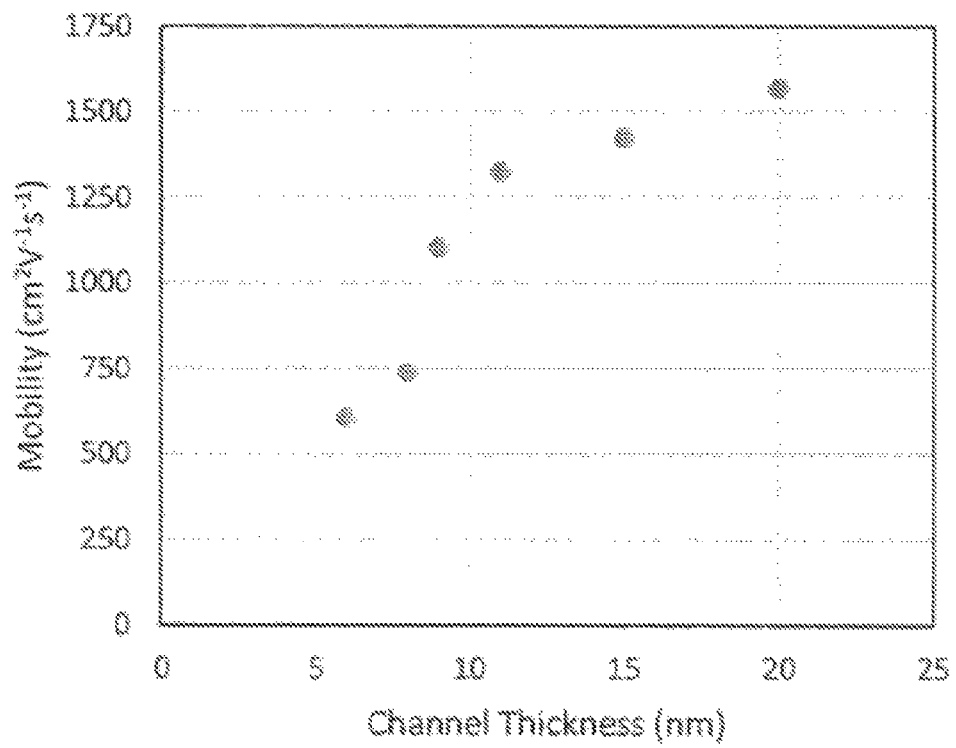
FIG. 6 illustrates the electron mobility of conventional HEMT structures (FIG. 4A) with different channel thicknesses measured at room temperature using Van der Pauw Hall measurement.

For the conventional HEMT structure (FIG. 4A) with a pure GaN channel, the electron mobility decreased drastically from 1105 cm$^2$/(V·s) with $n_s$=9.45×10$^{12}$ cm$^{-2}$ to 738 cm$^2$/(V·s) with $n_s$=1.231×10$^{13}$ cm$^{-2}$ when the channel thickness, $t_{ch}$, was decreased from 9 to 8 nm (FIG. 6). Note that in the latter case, the Si doping in the back-barrier was increased to compensate for the charge drop due to $t_{ch}$ reduction. As mentioned above, when the channel thickness was scaled down, the electric field in the channel increased and the 2DEG moved towards the AlN/GaN interface, leading to a stronger scattering at the interface.[11]

Figure 7:
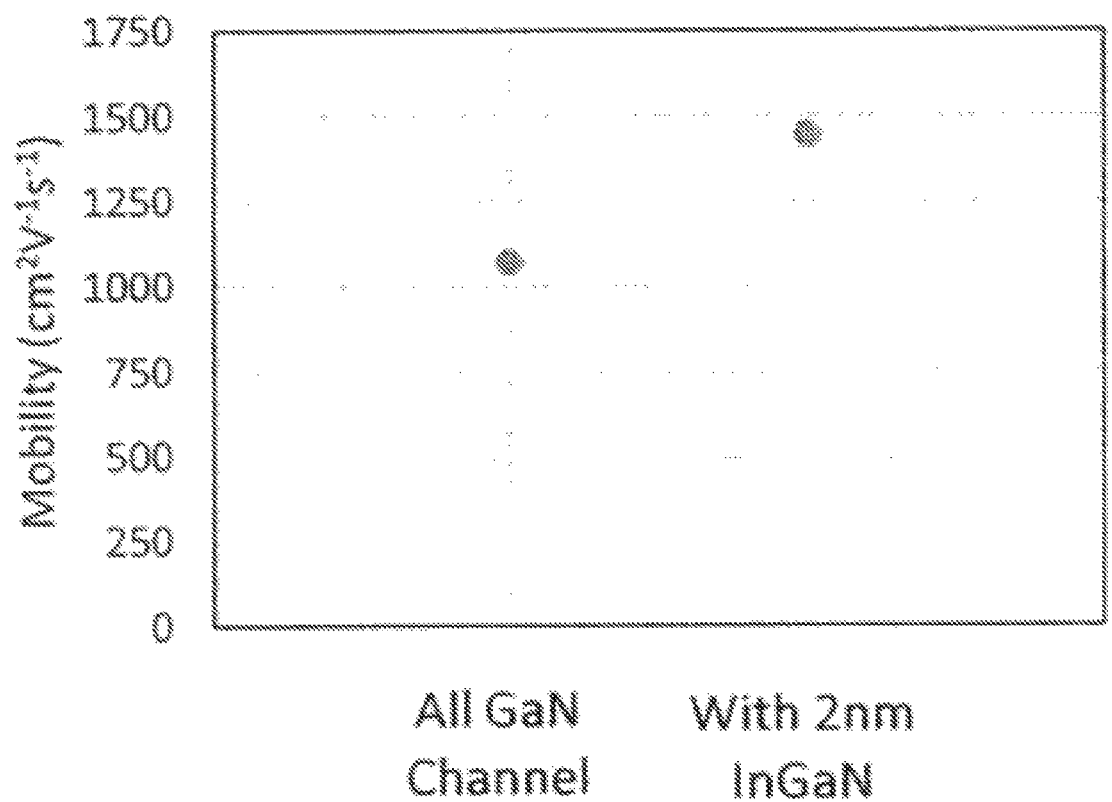
FIG. 7 illustrates experimental/measured electron mobility comparing the mobility for a 9 nm all GaN channel (traditional structure of FIG. 4A) with the mobility of a HEMT having a channel comprising 7 nm of GaN and 2 nm of $In_{0.1}Ga_{0.9}N$ (embodiment having the structure of FIG. 4B), showing that the addition on the InGaN layer results in an increase in electron mobility.

A one-dimensional self-consistent Poisson-Schrodinger solver was used to simulate the band diagrams and electron distributions.[17] Computer simulation using a one-dimensional Poisson-Schrodinger solver of the structure of FIG. 4B shows the displacement distance of the 2DEG from the AlN by the insertion of an InGaN layer of various thicknesses (Table 2). By replacing the top 2 nm of a 9 nm GaN channel with $In_{0.1}Ga_{0.9}N$, the composite channel HEMT has a mobility comparable to a 12 nm pure GaN channel sample. The decrease in total thickness for the same mobility provides improved gate control. FIG. 7 presents experimental results demonstrating these effects, wherein the mobility of an all GaN channel HEMT vs. a HEMT comprised of 7 nm of GaN and 2 nm of $In_{0.1}Ga_{0.9}N$ are compared, and the mobility for the structure with the InGaN has increased by 35% from 1074 cm$^2$V$^{-1}$s$^{-1}$ to 1446 cm$^2$V$^{-1}$s$^{-1}$.

TABLE 2

Distance between the centroid of the 2DEG and the AlN/GaN interface ($d_{2DEG-AlN}$) calculated using a one-dimensional Poisson-Schrodinger solver for the $In_{0.1}GaN/GaN$ composite channel HEMT structures, where $t_{channel}$ or $t_{ch}$ is the thickness of the channel and $t_{InGaN}$ is the thickness of the InGaN.

| | $t_{InGaN}$ | | |
|---|---|---|---|
| $d_{2DEG, AlN}$ (Å) | 0 nm | 2 nm | 4 nm |
| $t_{channel}$ 9 nm | 9.42 | 9.88 | 10.62 |
| 12 nm | 9.88 | | |
| 20 nm | 10.53 | | |

Figure 8:
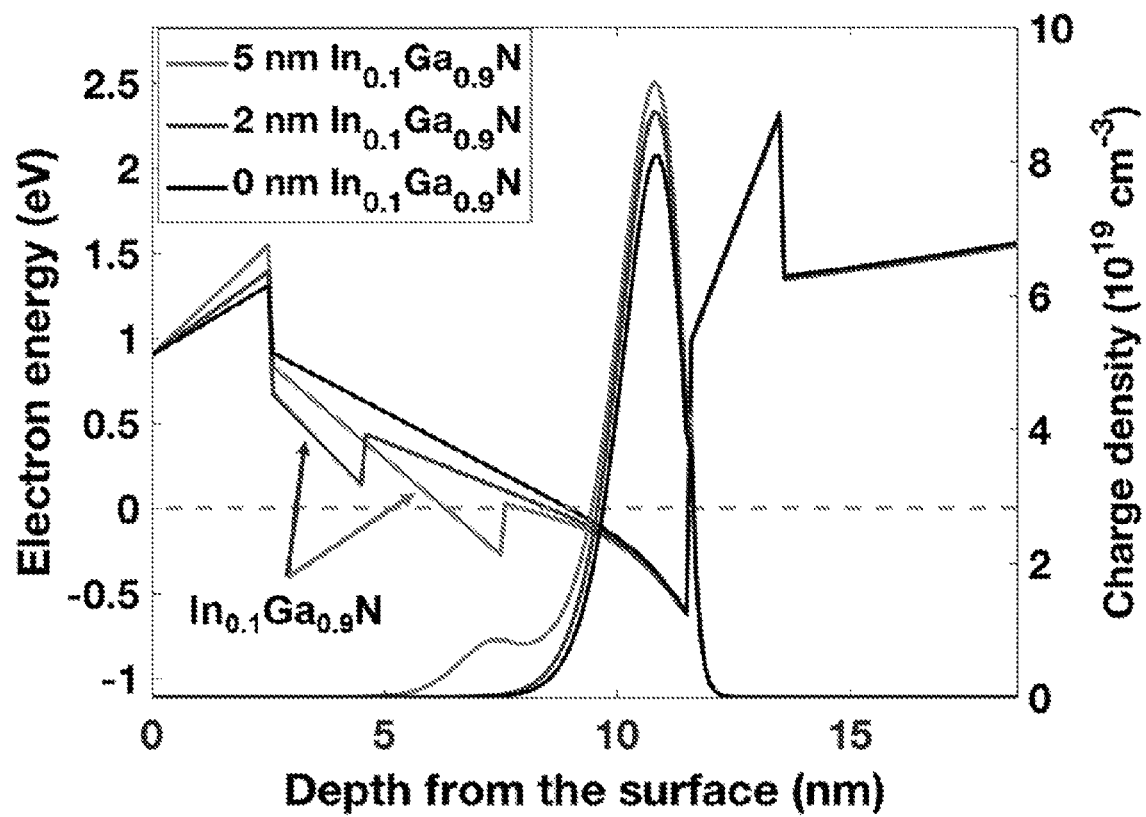
FIG. 8 illustrates electron band diagrams showing the conduction band profiles for N-polar HEMT structures with 0, 2 and 5 nm thick $In_{0.1}Ga_{0.9}N$ layers in 9 nm thick channels and the corresponding charge distributions of the 2DEGs, for the device structure of FIG. 4B.

FIG. 8 shows that, when replacing the upper portion of the GaN channel with a thin $In_xGa_{1-x}N$ ($x_{In}$=0.05-0.15, where $x_{In}$ is indium content) layer, a net positive polarization charge is introduced at the GaN/InGaN interface, increasing $n_s$, decreasing the electric field in the GaN channel and thereby increasing $d_{2DEG}$, and mitigating the scattering at the interface (FIG. 6). Moreover, the $In_xGa_{1-x}N$ layer leads to an increased reverse electric field in the $Al_{0.27}Ga_{0.73}N$ cap under the gate, which increases the breakdown voltage.

Figures 9A, 9B:
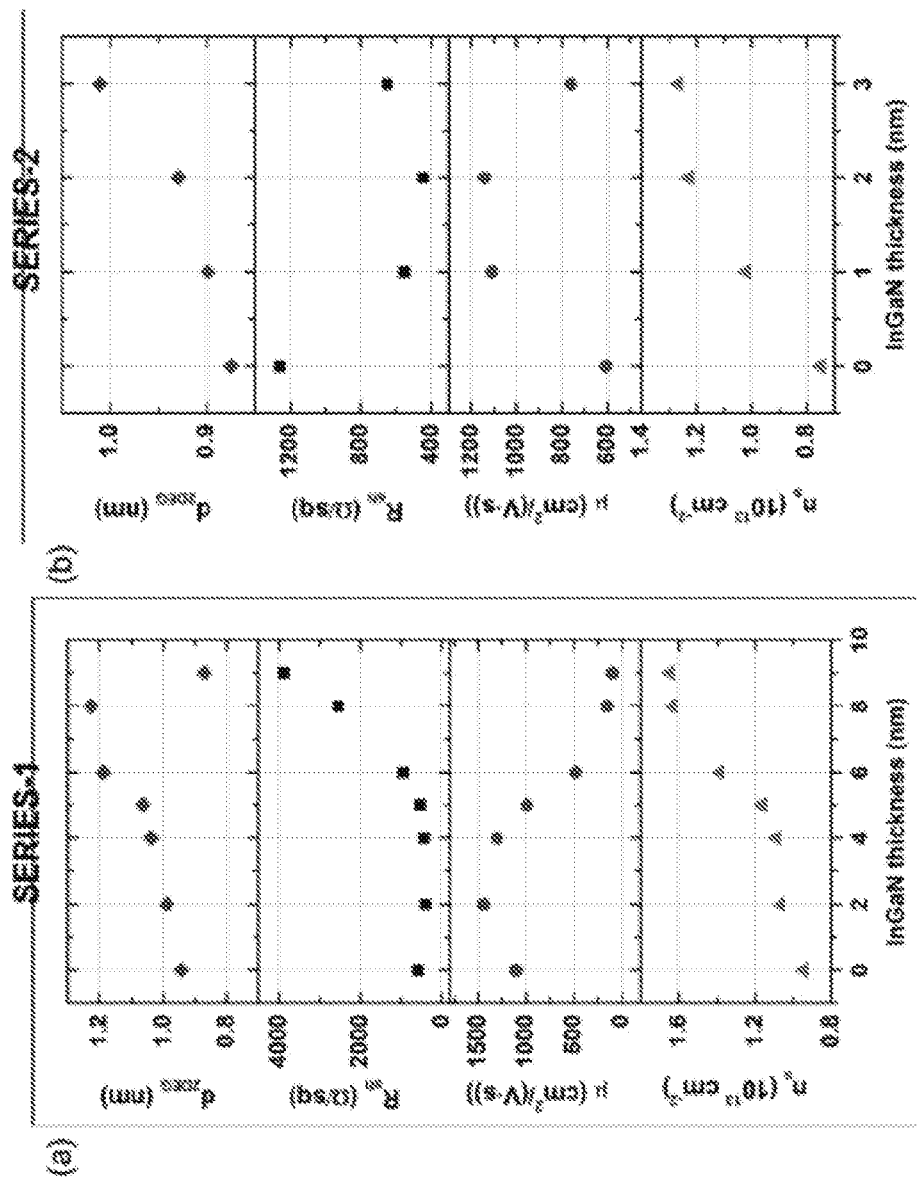
FIG. 9A plots sheet charge density, electron mobility, sheet resistance, and simulated distance between the centroid of the 2DEG and the AlN/(In,Ga)N interface for the HEMT structure of FIG. 4A having a 9 nm thick channel.
FIG. 9B plots sheet charge density, electron mobility, sheet resistance, and simulated distance between the centroid of the 2DEG and the AlN/(In,Ga)N interface for the HEMT structure of FIG. 4B having a 6 nm thick channel with varying $In_{0.1}Ga_{0.9}N$ thickness.

FIG. 9A presents the Hall data and the simulated $d_{2DEG}$ for samples in series-1 with $t_{ch}$=9 nm and $x_{In}$=0.1. The $n_s$ increased with increasing $t_{InGaN}$ due to the net positive polarization charge at the $GaN/In_{0.1}Ga_{0.9}N$ interface. As $t_{InGaN}$ increased, μ initially increased above the reference value for the sample with a pure GaN channel. This is in agreement with the premise that CIS scattering limits μ and the addition of the $In_{0.1}Ga_{0.9}N$ layer increases $d_{2DEG}$, thereby improving μ. As a coulombic scattering mechanism, CIS scattering exponentially decreases with increasing $d_{2DEG}$. Further increases in $t_{InGaN}$ above 2 nm resulted in a mobility drop. This is attributed to the population of the 2DEG in the $In_{0.1}Ga_{0.9}N$ layer (FIG. 8) which has a lower mobility due to alloy scattering. This effect of alloy scattering was clearly evident from the very low mobility of 98 cm²/(V·s) for the pure $In_{0.1}Ga_{0.9}N$ channel sample. Therefore, as a tradeoff between scattering mechanisms, for a channel thickness of 9 nm, an optimal $t_{InGaN}$ of 2 nm was found. The observed mobility of 1446 cm²/(V·s) and sheet resistance ($R_{sh}$) of 404.6 Ω/sq offered improvements over the pure GaN channel which showed p=1105 cm²/(V·s) and $R_{sh}$=598 Ω/sq. Similar to the samples with 9 nm thick channels, the HEMT structures in series-2 with $t_{ch}$=6 nm and $x_{In}$=0.1 also exhibited increasing $n_s$ with increasing $t_{InGaN}$. The highest μ of 1141 cm²/(V·s) and lowest $R_{sh}$ of 445 Ω/sq were obtained for the sample with a 4 nm GaN/2 nm $In_{0.1}Ga_{0.9}N$ composite channel, while a low mobility of 606 cm²/(V·s) was measured for the sample with a 6 nm thick pure GaN channel (FIG. 9B). Thus, introduction of a 2 nm thick $In_{0.1}Ga_{0.9}N$ layer increased p by a surprising and unexpected 73%. HEMT structures with channel thickness as thin as 4 nm were also investigated (series-3).

Figure 11:
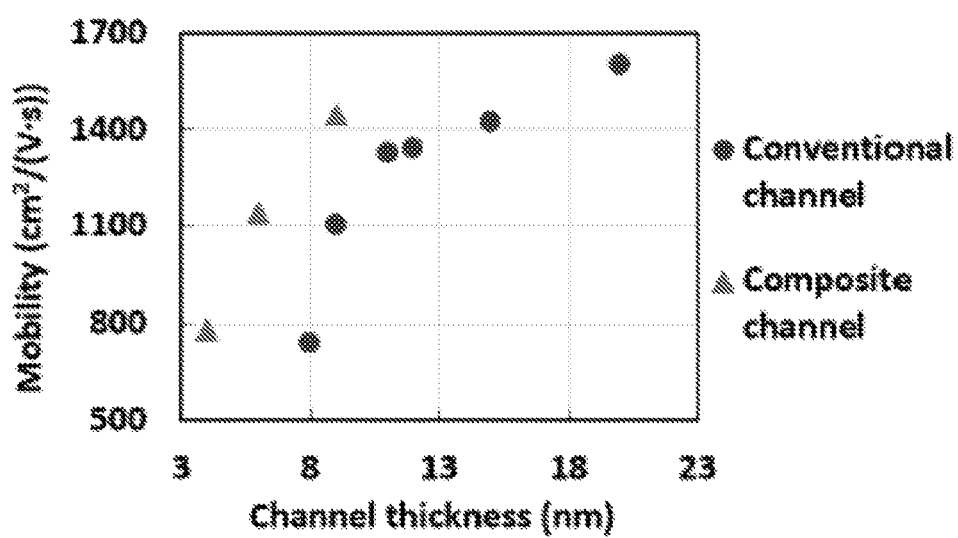
FIG. 11 plots electron mobility of HEMT structures having the structure of FIG. 4A with conventional GaN channels (blue dots) and electron mobility of HEMT structures of FIG. 4B with optimized GaN/InGaN composite channels (red triangle) and for different channel thicknesses.

The 2DEG in a channel composed of 3 nm GaN and 1 nm $In_{0.1}Ga_{0.9}N$ exhibited $n_s$=1.03×10¹³ cm⁻², μ=784 cm²/(V·s) and $R_{sh}$=773 Ω/sq, showing a better μ than the sample with an 8 nm thick pure GaN channel (FIG. 11).

Figures 10A, 10B:
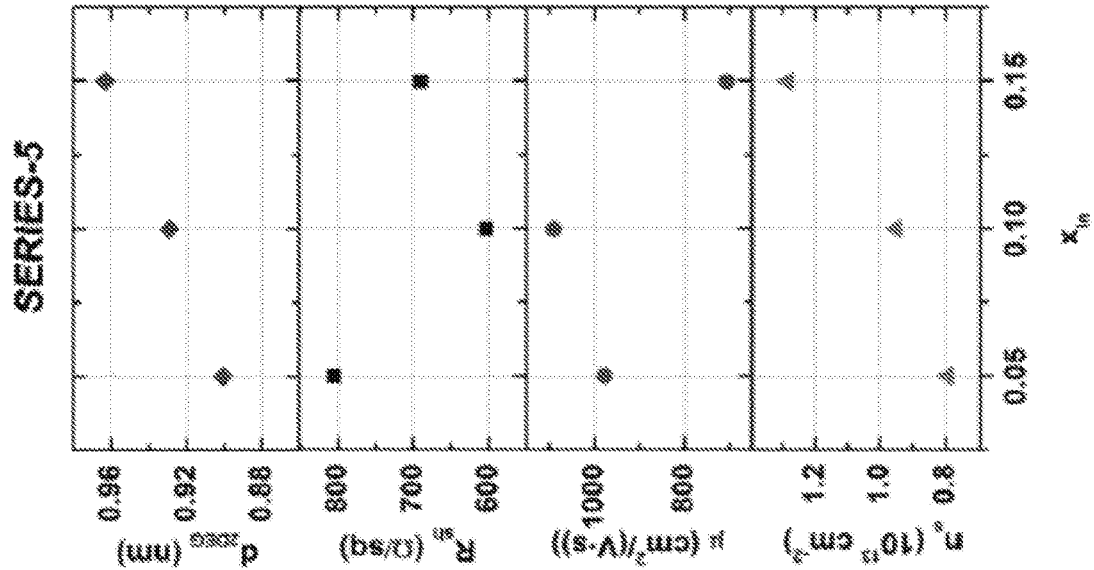
FIG. 10A plots sheet charge density, electron mobility, sheet resistance and simulated distance between the centroid of the 2DEG and the AlN/(In,Ga)N interface for the HEMT structure of FIG. 4A having a 9 nm thick channel comprising 3 nm $In_xGa_{1-x}N$ ($x_{In}$=0.08, 0.11, 0.15) 6 nm GaN.
FIG. 10B plots sheet charge density, electron mobility, sheet resistance and simulated distance between the centroid of the 2DEG and the AlN/(In,Ga)N interface for the HEMT structure of FIG. 4B having a 6 nm thick channel comprising 2 nm $In_xGa_{1-x}N$ ($x_{In}$=0.05, 0.10, 0.15) and 4 nm GaN.

To investigate the impact of $x_{In}$ on the HEMT structures, the 4th and 5th series of samples were grown and measured. Samples in the 4th series had composite channels consisting of 6 nm GaN and 3 nm $In_xGa_{1-x}N$ with $x_{In}$=0.08, 0.11 and 0.15. The samples with $x_{In}$=0.08 and 0.11 exhibited very similar properties with $n_s$≈1.18×10¹³ cm⁻², μ=1360 cm²/(V·s) and $R_{sh}$≈390 Ω/sq (FIG. 10A). The reduction in mobility to 1228 cm²/(V s) when $x_{In}$ was increased to 0.15 implied the formation of a 2DEG in the $In_{0.15}Ga_{0.85}N$ layer. The results show that $x_{In}$≤0.1 is preferred for the application in the HEMT structures with 9 nm thick channels.

Samples in the 5th series with 4 nm GaN/2 nm $In_xGa_{1-x}N$ ($x_n$=0.05, 0.10, 0.15) composite channels showed a different trend as compared to the samples in series-4. A clear optimal composition was found and the best Hall data were obtained for $x_{In}$=0.10 [FIG. 10B], indicating that for thinner channel samples, a higher $x_n$ was required to obtain enough 2DEG displacement away from the AlN/GaN interface. To reach the optimum electron mobility, both $t_{InGaN}$ and $x_{In}$ need to be carefully selected to effectively suppress the scattering at the AlN/GaN interface while maintaining minimal alloy scattering in the InGaN and CIS scattering at the GaN/InGaN interface.

4° misoriented substrates were used to ensure the growth of high quality N-polar films; however, the associated crystal misorientation resulted in the formation of surface steps, which in turn lead to a higher electron mobility parallel to the steps compared to the perpendicular direction. The p values determined in Hall measurements are typically 20% lower than the values parallel to the surface steps extracted from Transmission Line Measurements.[15,18] In devices, the higher p parallel to the steps is taken advantage of by aligning the devices in such a way that the electron transport occurs parallel to the steps.[16]

As shown in FIG. 11, the composite channel design significantly expanded the applicable channel thickness and therefore the scalability and design window for N-polar HEMT devices. However, as $t_{ch}$ keeps reducing, the impact of the scattering introduced by the InGaN layer (such as the CIS scattering at the GaN/InGaN interface and alloy scattering and alloy cluster scattering in the InGaN layer) on the 2DEG becomes significant. Further improvements can be expected by improving growth techniques to minimize the interface states at the GaN/InGaN interface and improve the uniformity of indium distribution in the InGaN film.[12,19]

Deep Recess Structure Example: Composite Channel N-Polar GaN MISHEMT with Deep Recess Structure for Improved W-Band Performance One or more embodiments of a deep recess device structure have enabled an N-polar deep recess (NPDR) HEMT having a record output power density of 6.7 W/mm operating at 94 GHz.

Figures 12A, 12B:
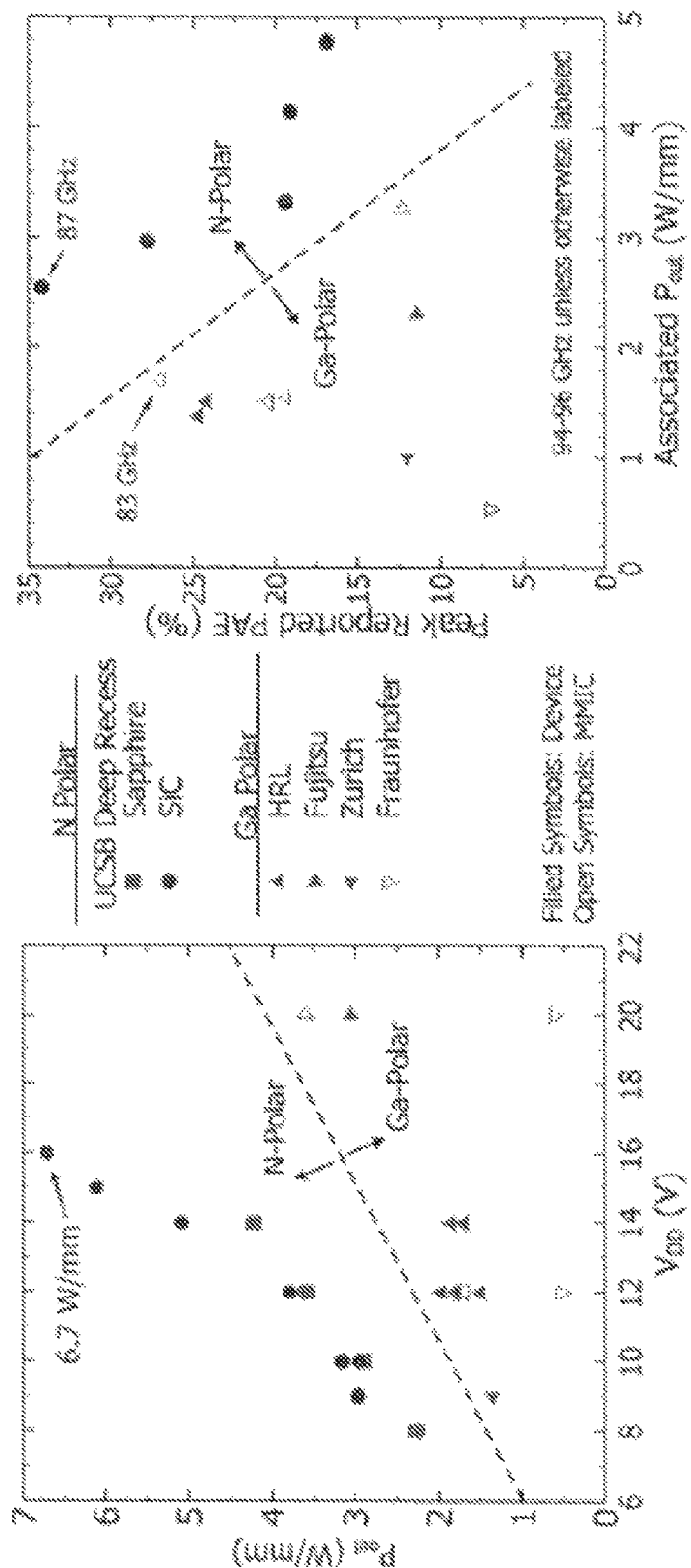
FIG. 12A plots N-polar GaN W-band output power density vs. supply voltage compared to reported values in the literature. A record value of 6.7 W/mm has been obtained at 16 V bias, and N-polar shows the highest power density for all measured drain biases.
FIG. 12B plots peak efficiency vs. associated output power density. NPDR devices have demonstrated higher efficiencies with higher output power as compared to Ga-polar devices.

FIGS. 12A and 12B illustrate the outstanding power density is approximately 2 times higher than the best reported Ga-polar device results at this frequency. The dramatic leap in performance was enabled by the unique advantages inherent to the deep recess design in the N-polar orientation. With this NPDR structure, transistors with a high $f_{max}$ (>300 GHz), high RF current swing (>2 A/mm), low DC knee voltage, low gate leakage, and extremely low DC-RF dispersion are achieved simultaneously in the same individual device.

Figures 13A, 13B, 13C:
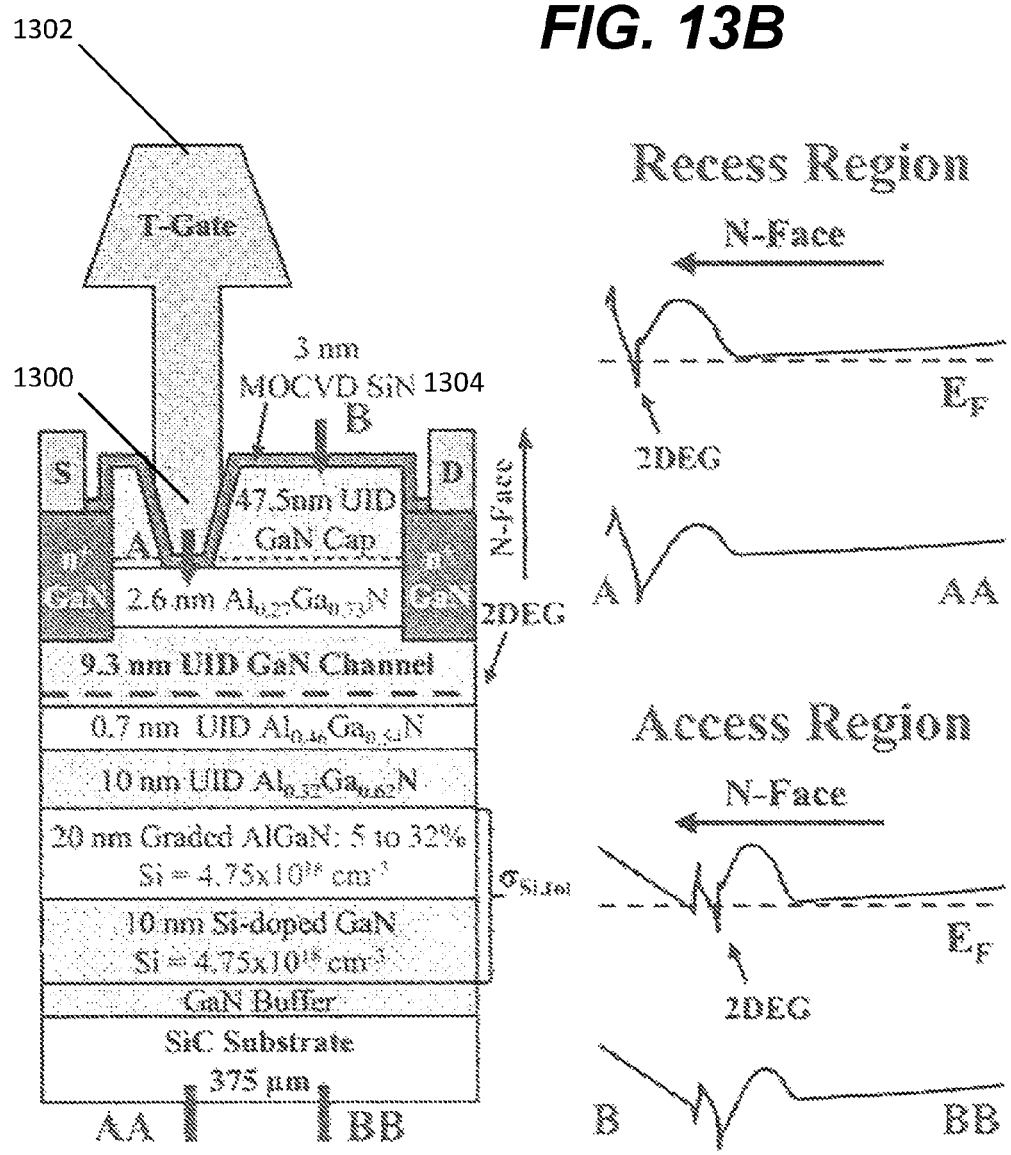
FIG. 13A illustrates a cross-section of an N-Polar MISHEMT device structure (not to scale).
FIG. 13B plots the energy band diagram at equilibrium in the gate recessed region of FIG. 13A.
FIG. 13C plots the energy band diagram at equilibrium in the access region of the device of FIG. 13A.
Figures 14A, 14B, 14C:
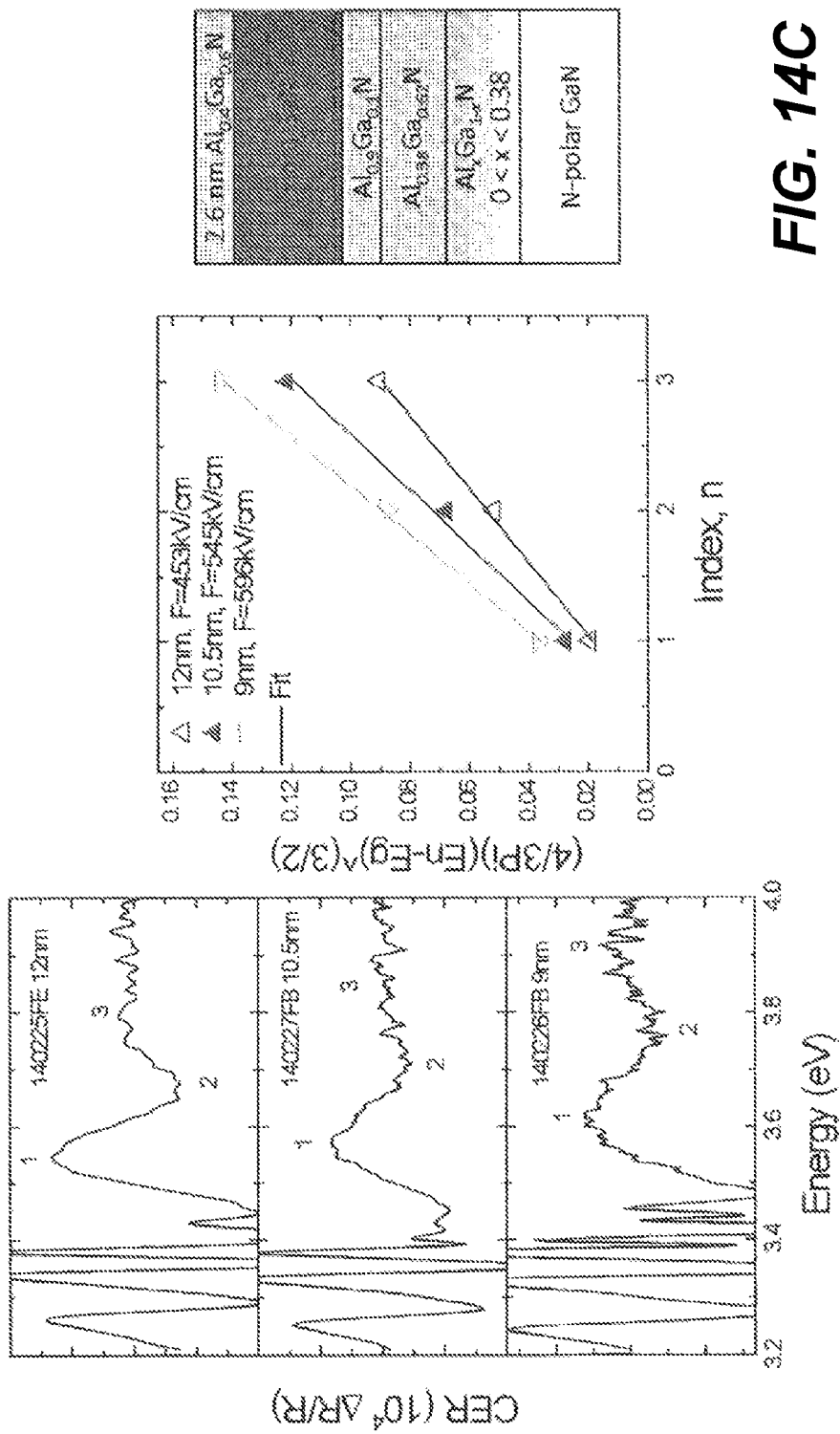
FIGS. 14A-14B illustrate CER spectra of N-polar HEMTs with different GaN channel thickness and Frank Keldysh oscillation analysis allowing the determination of the electric field in the GaN channel.

The results of FIG. 12A were achieved using devices having the structure of FIG. 13A with a 9.3 nm thick GaN channel (band diagrams shown in FIG. 13B and FIG. 13C). Further reduction in the channel thickness resulted in a degradation of device performance, because the electron mobility in N-polar HEMTs decreases with increasing electric field in the portion of the GaN channel where the 2DEG is located[1]. Theoretical studies imply that this behavior is a result of the 2DEG centroid moving closer to the GaN channel/AlGaN back-barrier interface where charged interfacial state scattering reduces the electron mobility.[2] The increase in electric field with decreasing channel thickness was experimentally confirmed by contactless electroreflectance (CER) 3 measurements conducted at Wroclaw University of Technology (illustrated in FIG. 14A).

In order to minimize the electric field in the channel while maintaining a thin channel, the Aluminum composition in the AlGaN cap/etch stop was reduced in the NPDR transistor relative to earlier N-Polar HEMTs. To maintain etch selectivity and high breakdown voltages, however, the composition of the AlGaN cap cannot be decreased much further.

FIGS. 15A-15D illustrate an alternative method to reduce the electric field in the GaN channel by inserting a thin InGaN layer prior to the deposition of the AlGaN etch stop layer.

The gate recessed area's epitaxial device structure and channel band diagram (conduction band only) are compared for 2 NPDR MISHEMTs.

Figure 15A:
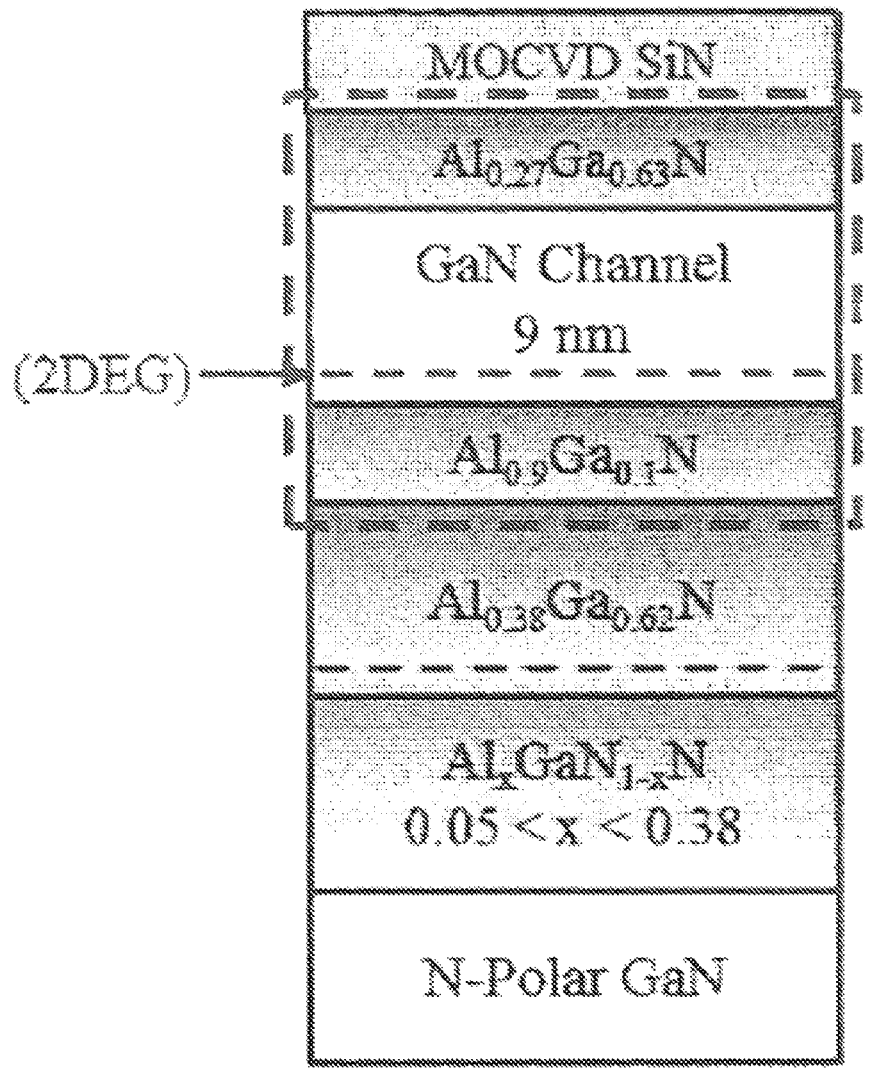
FIG. 15A illustrates a cross-section of the NPDR epitaxial structure in the gate recessed area of the transistor for a previous generation NPDR MISHEMT with a 9 nm GaN channel.
Figure 15B:
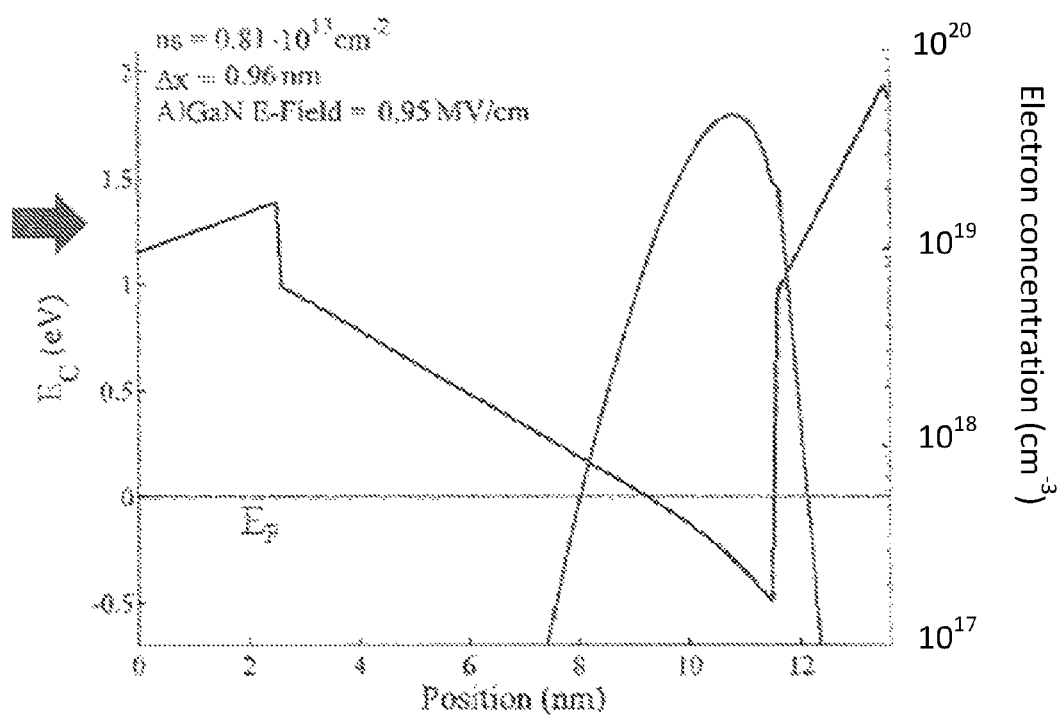
FIG. 15B is a band diagram for the channel region of structure of FIG. 15A (conduction band only)

FIG. 15A shows a previous generation NPDR MISHEMT with a 9 nm all GaN channel and FIG. 15B shows the band diagram for the structure of FIG. 15A.

Figure 15C:
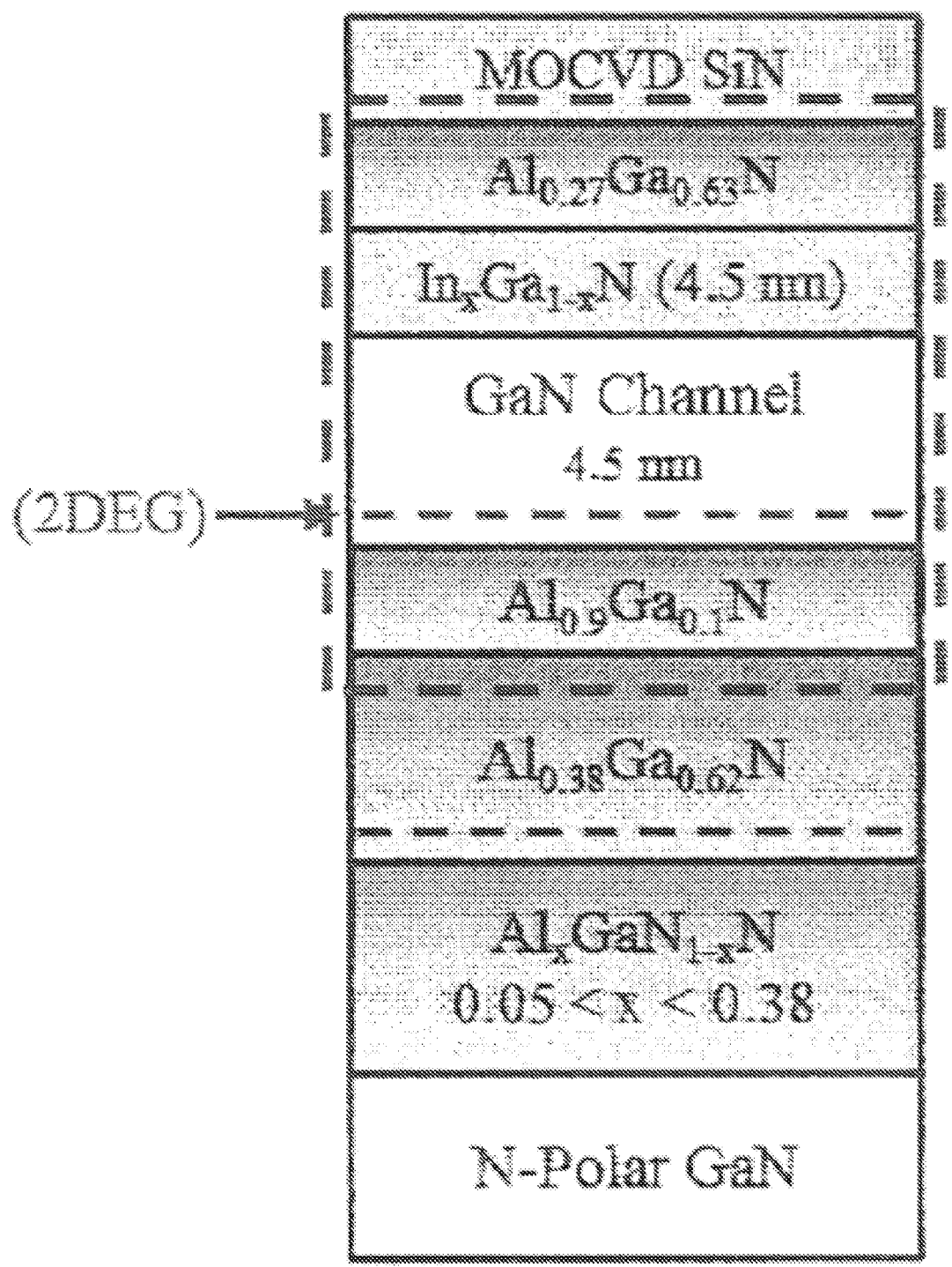
FIG. 15C depicts a novel field shaped NPDR MISHEMT with a 9 nm channel (4.5 nm GaN/4.5 nm $In_{0.10}Ga_{0.90}N$), according to one or more embodiments of the present invention.

FIG. 15C depicts a 9 nm field shaped NPDR MISHEMT whose channel is ½ GaN and ½ $In_{0.10}Ga_{0.90}N$ (4.5 nm GaN/4.5 nm $In_{0.10}Ga_{0.90}N$).

Figure 15D:
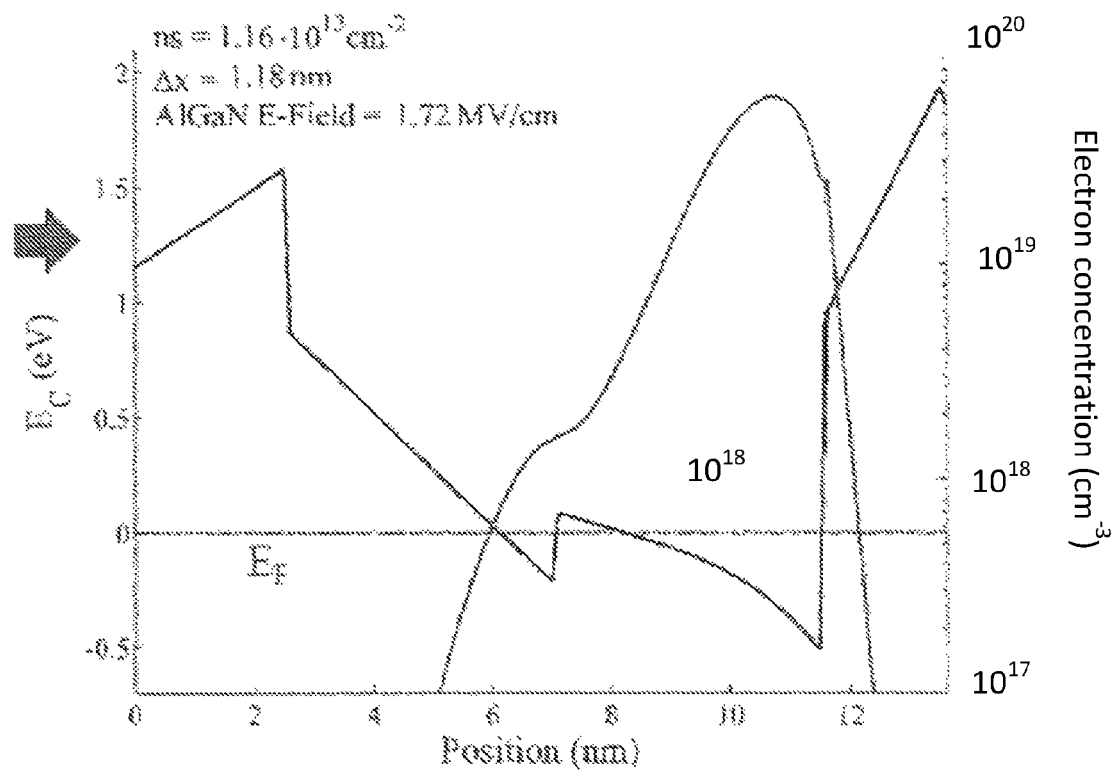
FIG. 15D is a band diagram for the channel region of the structure of FIG. 15C (conduction band only).
Figure 15E:
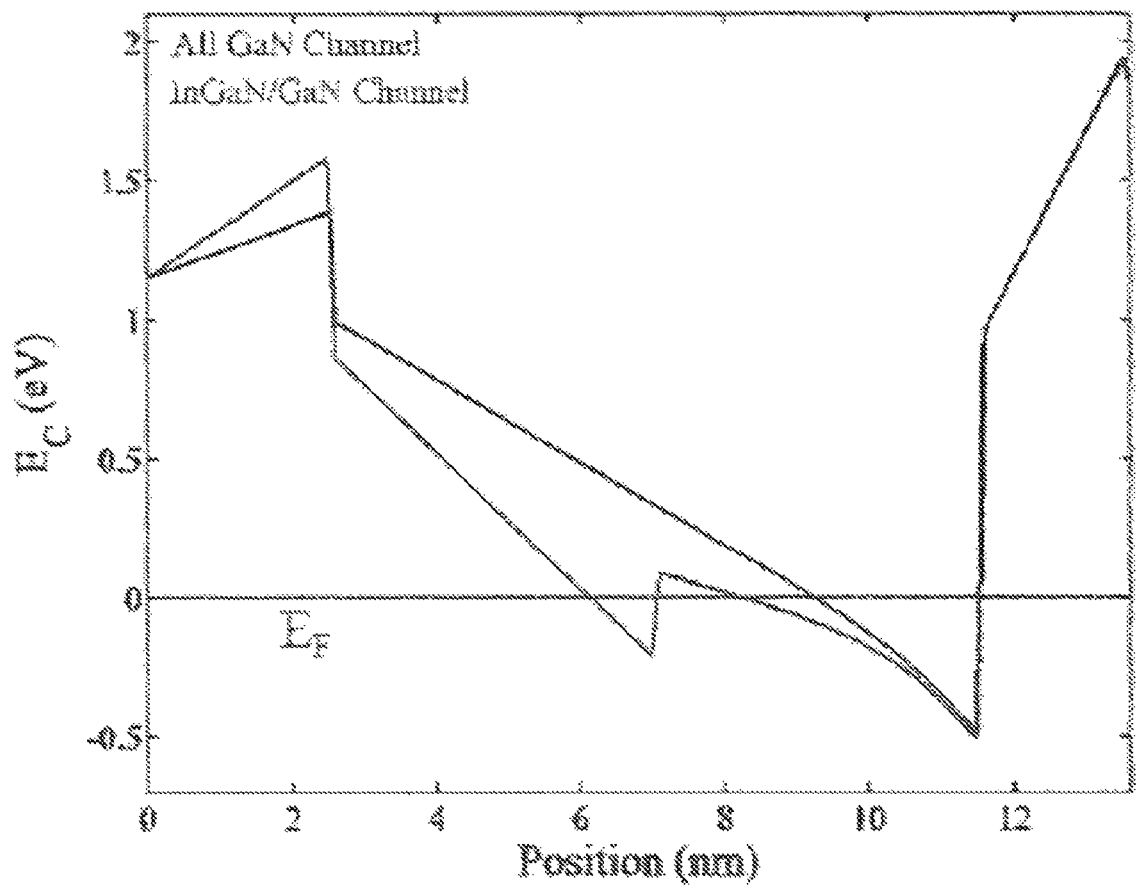
FIG. 15E overlays the band diagrams for the structures of FIG. 15A and FIG. 15C for visual clarity.

The band diagram for the structure of FIG. 15C is shown in FIG. 15D. In-figure text on the band diagrams of FIG. 15B and FIG. 15D indicate the channel sheet charge density ($n_s$), the location of the 2DEG centroid relative to the AlGaN back-barrier ($\Delta x$), and the magnitude of the reverse electric field in the AlGaN cap. According to these simulations, the inserted $In_{0.10}Ga_{0.90}N$ layer increases both the sheet charge density ($\Delta ns=3.5 \cdot 10^{13}$ cm$^{-2}$) and the reverse electric field in the AlGaN cap ($\Delta E$-field=0.77 MV/cm) relative to the all GaN channel. Further, the inserted $In_{0.10}Ga_{0.90}N$ layer relaxes the electric field in the GaN portion of the channel, pulling the centroid of the 2DEG away from the AlGaN interface and potentially improving the electron mobility in the channel as predicted in reference[2]. FIG. 15E overlays the band diagrams of FIG. 15B and FIG. 15D for visual clarity.

FIGS. 16A-16D compare the access regions of the NPDR MISHEMTs with GaN caps. The total electron density is approximately the same in the two access regions. However, in the previous generation NPDR MISHEMT (FIG. 16A), part of the electron concentration is located in a secondary 2DEG at the GaN cap/AlGaN cap interface. This secondary 2DEG does not contribute to conduction. The field shaping NPDR of FIG. 16C removes this secondary 2DEG and transfers its charge into the current carrying channel 2DEG, greatly enhancing the conductivity in the access regions of the field shaped NPDR MISHEMT relative to previous NPDR MISHEMTs.

Figures 17A, 17B, 17C:
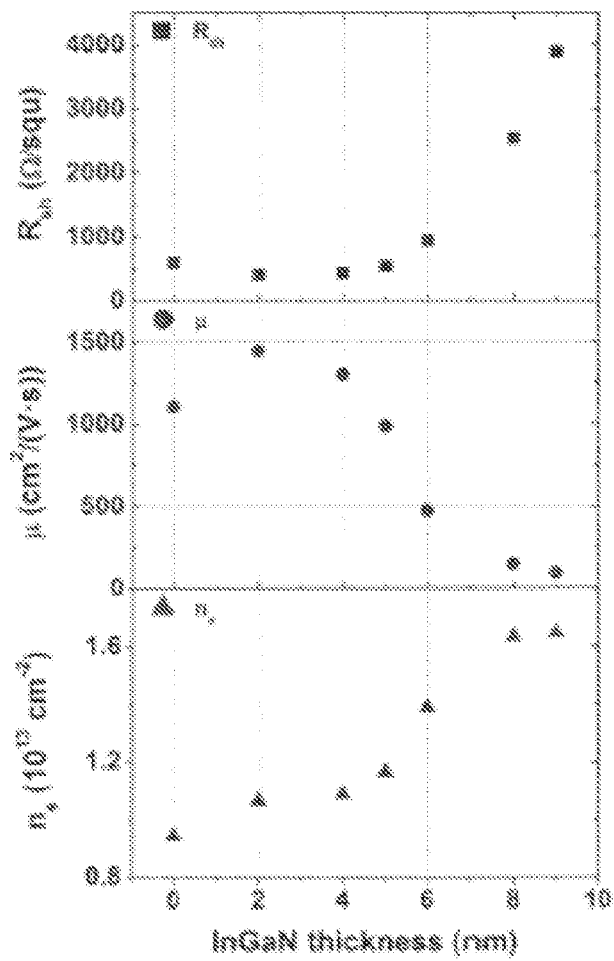
FIG. 17A-17D plot electron sheet density ($n_s$), mobility ($\mu$), and sheet resistance $R_{sh}$ as a function of InGaN thickness for the device of FIG. 16C, FIG. 17D compares the performance of planar, an NPDR-MISHEMT device on a sapphire substrate, and an NPDR-MISHEMT on a SiC substrate.

FIGS. 17A-C show In-dot Hall data for initial samples grown with a 9 nm total channel thickness (GaN thickness=9 nm-InGaN thickness). Between approximately 2 and 4 nm of InGaN the sheet resistance is minimized.

Figure 17D:
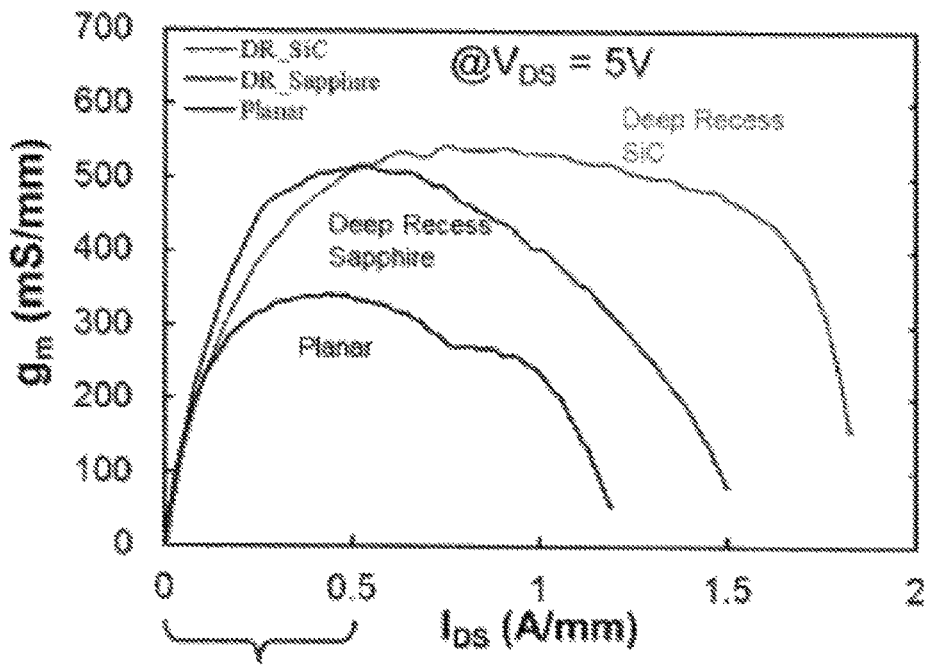
Figure 17E:
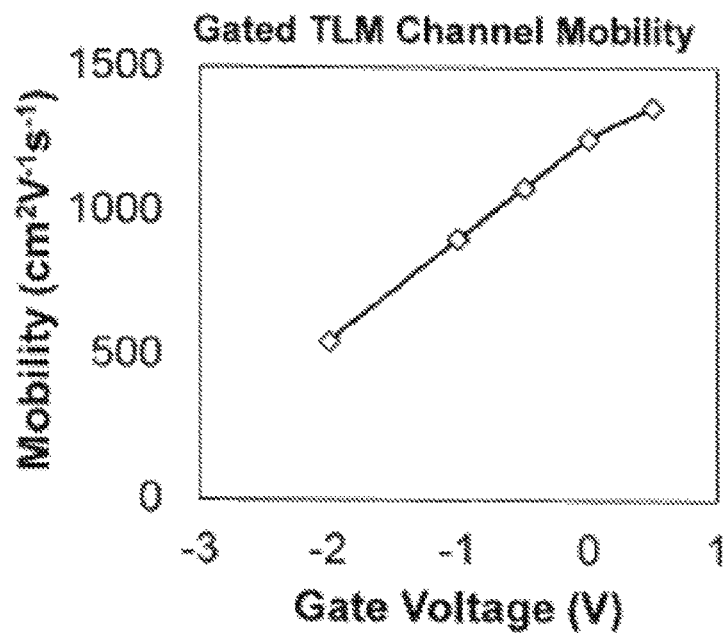
FIG. 17E is a TLM measurement illustrating maximized/increased for a wide bias range, particularly near pinch-off.

FIG. 17D compares the performance of planar, an NPDR-MISHEMT device on a sapphire substrate, and an NPDR-MISHEMT on a SiC substrate, and FIG. 17E is a TLM measurement. FIG. 17D and FIG. 17E illustrate the channel structure including InGaN can maximize/increase mobility and $g_m$ for a wide bias range, particularly near pinch-off.

N-Polar HEMTs with In Situ n+ GaN Ohmic Contact and Various Device Structures and Self-Aligned Process for MIS-HEMTs with an InGaN Composite Channel a. Structure FIGS. 18A-18I illustrate a process flow for (transfer-length measurements) TLM structures using a GaN over AlGaN selective etch.

FIG. 18A illustrates fabricating or obtaining a structure comprising an InGaN/GaN channel, an AlGaN cap on the channel, in situ n+_GaN on the AlGaN cap, and MOCVD grown dielectric (e.g., SiNx) on the in situ n+_GaN.

FIG. 18B illustrates using atomic layer deposition (ALD) to deposit $Al_2O_3$ (ALD $Al_2O_3$) on the MOCVD SiNx and using plasma-enhanced chemical vapor deposition (PECVD) to deposit dielectric, e.g., SiNx (PECVD $SiN_x$) on the ALD $Al_2O_3$.

FIG. 18C illustrates lithography of photoresist (e.g., SPR 955-CM-0.9) on the PECVD $SiN_x$.

FIG. 18D illustrates etching/forming an opening/recess 1800 down to and into the ALD deposited $Al_2O_3$ FIG. 18E illustrates removal of the photoresist and the remaining $Al_2O_3$ in the opening region.

FIG. 18F illustrates further etching/deepening of the opening/recess down to and into the AlGaN cap.

FIG. 18G illustrates removal of the PECVD $SiO_2$, ALD $Al_2O_3$, and MOCVD $SiN_x$.

FIG. 18H illustrates deposition of $SiN_x$ by MOCVD onto the in situ n+ GaN and on the AlGaN cap and in situ n+ GaN in the opening.

FIG. 18I illustrates removal of MOCVD $SiN_x$ in selected areas and deposition of metal contacts (Ti/Au) to make ohmic contact to the in situ n+ GaN in the selected areas.

Figures 19A, 19B:
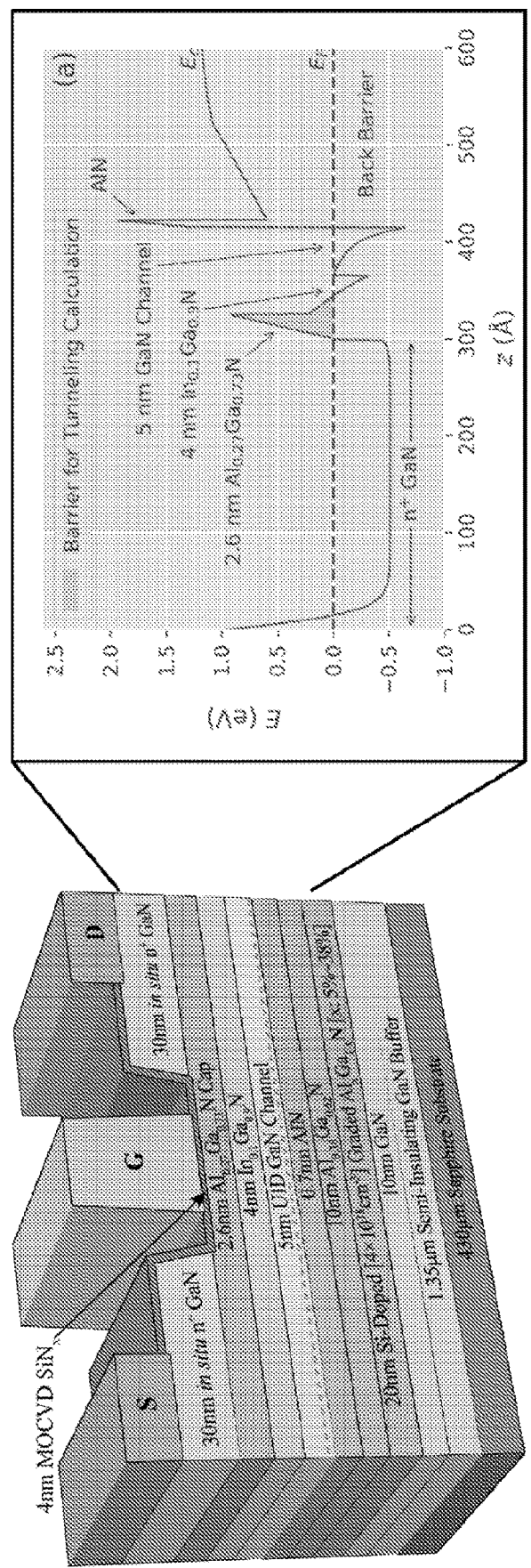
FIG. 19A illustrates a HEMT structure fabricated using the method of FIGS. 18A-18I and FIG. 19B plots energy (eV) as a function of distance through the indicated layers of the structure of FIG. 19A.

FIG. 19A illustrates a HEMT structure fabricated using the method of FIGS. 18A-18J and FIG. 19B plots energy (eV) as a function of distance through the indicated layers of the structure of FIG. 19A.

b. Characterization

A simplified calculation[22] or tunneling model is used to calculate current density J and electric field in the structure, wherein image force correction is not included, the electron effective mass $m^*_e$ in GaN is used for both the barrier and conducting layer, and double barrier tunneling current is ignored:

$$\ln P(E_z) = -\frac{2\sqrt{2m^*}}{\hbar} \int_{z_1}^{z_2} \sqrt{\phi_{Barrier} - E_z}\, dz$$

$$J = q\frac{4\pi m^* kT}{h^3} \int_0^\infty P(E_z)\ln\left(\frac{1+e^{\frac{E_F-E_z}{kT}}}{1+e^{\frac{E_F-E_z-V}{kT}}}\right) dE_z$$

Figures 20A, 20B, 20C, 20D:
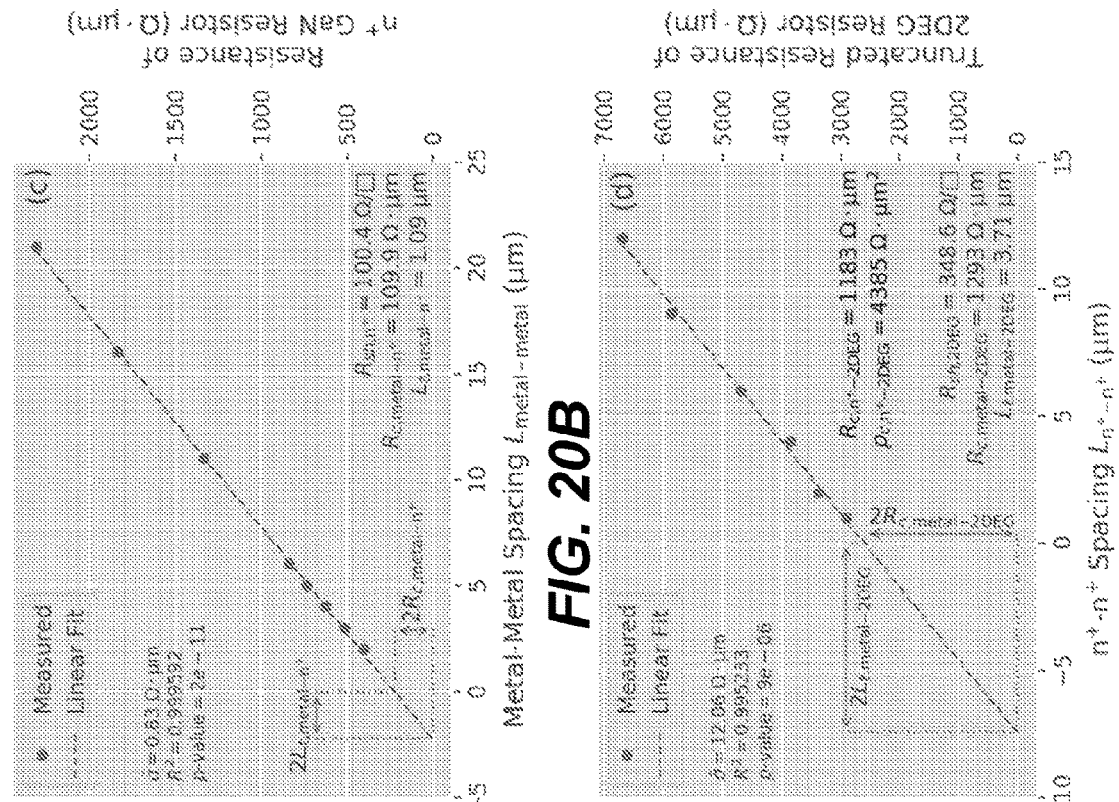
FIGS. 20A-20D compare the contact resistivity between the $n^+$ GaN and the GaN channel 2DEG though the AlGaN cap layer ($\rho_{c,\ n+\text{-}2DEG}$) calculation with the extraction from TLM, plotting simulated energy as a function of distance through the structure (FIG. 20A), measured resistance of the $n^+$ GaN resistor ($\Omega \cdot \mu m$) as a function of distance between the metal contacts (in micrometers) (FIG. 20B), calculated current density as a function of applied voltage (FIG. 20C), and truncated resistance of the 2DEG resistor ($\Omega \cdot \mu m$) as a function of distance between the $n^+$ GaN layers of the TLM structures (in micrometers) (FIG. 20D).

FIGS. 20A-20D compare the contact resistivity between the n+ GaN and the GaN channel 2DEG though the AlGaN cap layer ($\rho_{c,\,n+\text{-}2DEG}$) calculation with the extraction from TLM, plotting simulated energy as a function of distance through the structure (FIG. 20A), measured resistance of the n+ GaN resistor ($\Omega\cdot\mu m$) as a function of distance between the metal contacts (in micrometers) (FIG. 20B), calculated current density as a function of applied voltage (FIG. 20C), and truncated resistance of the 2DEG resistor ($\Omega\cdot\mu m$) as a function of distance between the n+ GaN layers of the TLM structures (in micrometers) (FIG. 20D).

FIGS. 21A-21D show measurements and calculations for the ohmic contact region of the structure of FIG. 19A with a channel comprising 2 nm thick InGaN on 4 nm thick GaN, plotting simulated energy as a function of distance through the structure (FIG. 21A), comparison of calculated $\rho_{c,\,n+\text{-}2DEG}$ ($\Omega\cdot\mu m^2$) as a function of transfer length extracted from TLM ($L_{t,\,metal\text{-}2DEG}$, in micrometers) with previously yielded results with ex situ regrown n+ GaN contacts by Molecular Beam Epitaxy (MBE) or MOCVD (FIG. 21B), calculated current density as a function of applied voltage (FIG. 21C), and comparison of n+ GaN-2DEG contact resistance ($R_{c,\,n+\text{-}2DEG}$) ($\Omega\cdot\mu m$) as a function of $L_{t,\,metal\text{-}2DEG}$ with previously yielded results with ex situ regrown n+ GaN contacts by MBE or MOCVD (FIG. 21D), showing the calculated results close to the regrown contact results.

FIGS. 22A-22D compare the energy band diagram and current density for the ohmic contact region of the structure of FIG. 19A with a composite channel (2 nm thick InGaN and 4 nm thick GaN) with the structure of FIG. 19A with a 9 nm GaN channel, plotting energy as a function of distance through the structure with the composite channel (FIG. 22A), energy as a function of distance through the structure with the 9 nm thick GaN channel (FIG. 22B), current density as a function of applied voltage for the device of FIG. 19A with composite channel (FIG. 22C), and current density as a function of applied voltage for the device of FIG. 19A with the 9 nm GaN channel (FIG. 22D), showing significantly lower $\rho_{c,\ n+-2DEG}$ ($\Omega \cdot \mu m^2$) for the 2 nm/4 nm InGaN/GaN composite channel device as compared to the 9 nm GaN channel device.

FIGS. 23A-23D show the energy and current density for the ohmic contact region of the structure of FIG. 19A with a composite channel (2 nm thick InGaN and 4 nm thick GaN) and an 1.6 nm thick AlGaN cap, plotting simulated energy as a function of distance through the structure (FIG. 23A), comparison of calculated $\rho_{c,\ n+-2DEG}$ ($\Omega \cdot \mu m^2$) as a function of $L_{t,\ metal-2DEG}$ (in micrometers) with previously yielded results with ex situ regrown n$^+$ GaN contacts by MBE or MOCVD (FIG. 23B), calculated current density as a function of applied voltage (FIG. 23C), and comparison of $R_{c,\ n+-2DEG}$ ($\Omega \cdot \mu m$) as a function of $L_{t,\ metal-2DEG}$ with previously yielded results with ex situ regrown n$^+$ GaN contacts by MBE or MOCVD (FIG. 23D), showing results competitive with the best regrown contact results.

c. Self-Aligned Process #1: PECVD SiN$_x$ Passivation

FIGS. 24A-24H illustrate a process flow continuing from after the step of FIG. 18F.

FIG. 24A illustrates the structure of FIG. 18F obtained after the steps of FIG. 18A-18F.

FIG. 24B illustrates deposition of additional MOCVD SiN$_x$ on the PECVD SiO$_2$ and in the opening/recess on the sidewalls of the in situ n$^+$_GaN and on the AlGaN cap; and deposition of additional ALD Al$_2$O$_3$ on the additional MOCVD SiN$_x$ (including in the opening/recess); and deposition of additional PECVD SiO$_2$ on the additional ALD Al$_2$O$_3$ (including in the opening/recess).

FIG. 24C illustrates removal of the additional PECVD SiO$_2$ outside the opening 1800 and forming/etching an additional opening 1802 in the additional PECVD SiO$_2$ within the original opening/recess, so as to expose the additional ALD Al$_2$O$_3$ on the additional MOCVD SiN$_x$ on the AlGaN cap.

FIG. 24D illustrates removal of the additional ALD Al$_2$O on the top surface outside the opening and in the opening.

FIG. 24E illustrates deposition of gate metal G on portions of the additional MOCVD SiN$_x$ outside the opening and in the opening so as to contact the MOCVD SiN$_x$ in the opening.

FIG. 24F illustrates removal of some of the additional MOCVD SiN$_x$, removal of the PECVD SiO$_2$, and removal of the ALD Al$_2$O$_3$, so that the gate G contacts the MOCVD SiN$_x$ in the opening.

FIG. 24G illustrates removal of MOCVD SiN$_x$ in selected areas and deposition of metal contacts to make ohmic source S and drain D contacts to the in situ n$^+$ GaN in the selected areas.

FIG. 24H illustrates deposition of PECVD SiN$_x$ all around the gate G, in the opening on the MOCVD SiN$_x$, and on the source S and drain D.

d. Self-Aligned Process #2: MOCVD SiN$_x$ Passivation

FIGS. 25A-25H illustrate a process flow continuing from after the step of FIG. 18F.

FIG. 25A illustrates the structure of FIG. 18F obtained after the steps of FIG. 18A-18F.

FIG. 25B illustrates deposition of additional MOCVD SiN$_x$ on the PECVD SiO$_2$ and in the opening/recess on the sidewalls of the in situ n$^+$_GaN and on the AlGaN cap.

FIG. 25C illustrates removal of the additional MOCVD SiN$_x$ outside the opening and forming/etching an additional opening 2502 in the additional MOCVD SiN$_x$ within the original opening/recess, so as to expose the AlGaN cap.

FIG. 25D illustrates deposition of a thin layer of further MOCVD SiN$_x$ on top of the additional MOCVD SiN$_x$, including in the opening and on the AlGaN cap.

FIG. 25E illustrates deposition of gate metal G on portions of the further MOCVD SiN, outside the opening and in the opening and so as to contact the MOCVD SiN$_x$ in the opening.

FIG. 25F illustrates removal of the PECVD SiO$_2$, removal of the ALD Al$_2$O$_3$, and MOCVD SiN$_x$ on the PECVD SiO$_2$ outside the opening, so that the gate G contacts the MOCVD SiN$_x$ in the opening and overhangs the MOCVD SiN$_x$ outside the opening.

FIG. 25G illustrates removal of MOCVD SiN$_x$ in selected areas and deposition of metal contacts to make ohmic source S and drain D contacts to the in situ n$^+$ GaN in the selected areas.

e. Self-Aligned Process #3: MOCVD SiN$_x$ Passivation and MOCVD Al$_2$O$_3$ Dielectric FIGS. 26A-26H illustrate a process flow continuing from after the step of FIG. 18F.

FIG. 26A illustrates the structure of FIG. 18F obtained after the steps of FIG. 18A-18F.

FIG. 26B illustrates deposition of Al$_2$O$_3$ by MOCVD (MOCVD Al$_2$O$_3$) on the PECVD SiO$_2$ followed by additional MOCVD SiN$_k$ including in the opening/recess on the sidewalls of the in situ n$^+$_GaN and on the AlGaN cap.

FIG. 26C illustrates removal of the additional MOCVD SiN$_x$ outside the opening and forming/etching an additional opening 2602 in the additional MOCVD SiN$_x$ within the original opening/recess, so as to expose the MOCVD Al$_2$O$_3$ on the AlGaN cap.

FIG. 26D illustrates deposition of gate metal G on portions of the MOCVD Al$_2$O$_3$ outside the opening and in the opening and so as to contact the MOCVD Al$_2$O$_3$ in the opening.

FIG. 26E illustrates removal of the PECVD SiO$_2$, removal of the ALD Al$_2$O$_3$ and some of the MOCVD Al$_2$O$_3$ on the PECVD SiO$_2$ outside the opening, so that the gate G contacts the MOCVD Al$_2$O$_3$ in the opening and overhangs the MOCVD SiN$_x$ outside the opening.

FIG. 26F illustrates removal of MOCVD SiN$_x$ in selected areas and deposition of metal contacts to make ohmic source S and drain D contacts to the in situ n$^+$ GaN in the selected areas.

f. Self-Aligned Process #4: Regrown GaN Cap Passivation

FIGS. 27A-27H illustrate a process flow continuing from after the step of FIG. 18F.

FIG. 27A illustrates the structure of FIG. 18F obtained after the steps of FIG. 18A-18F.

FIG. 27B illustrates regrowing a GaN cap in the opening.

FIG. 27C illustrates removing/etching the GaN cap so as to expose the AlGaN cap in the opening.

FIG. 27D illustrates deposition of the additional MOCVD SiN$_x$ outside the opening and on the regrown GaN cap inside the opening.

FIG. 27E illustrates deposition of gate metal G on portions of the MOCVD SiN$_x$ outside the opening and in the opening and so as to contact the MOCVD SiN$_x$ in the opening.

FIG. 27F illustrates removal of the PECVD SiO$_2$, removal of the ALD Al$_2$O$_3$ and some of the MOCVD SiN$_x$ on the PECVD SiO$_2$ outside the opening, so that the gate G contacts the MOCVD SiN$_x$ in the opening and overhangs the MOCVD SiN$_x$ outside the opening.

FIG. 27G illustrates removal of MOCVD SiN$_x$ in selected areas and deposition of metal contacts to make ohmic source S and drain D contacts to the in situ n$^+$ GaN in the selected areas.

Process Steps

Figure 28:
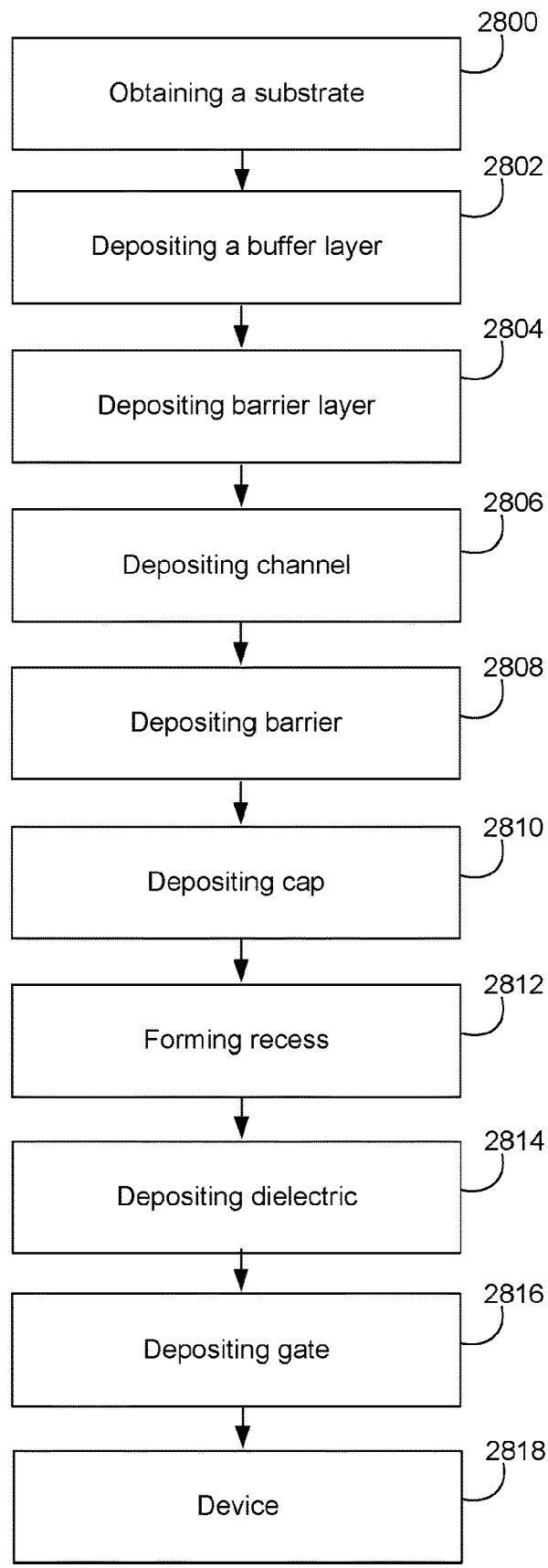
FIG. 28 is a flowchart illustrating a method of fabricating a device according to one or more embodiments of the present invention.

FIG. 28 is a flowchart illustrating a method for fabricating a device structure for an n-type or p-type field effect transistor (FET), referring also to FIGS. 4B, 13A, 16A, and 16C. The method comprises the following steps.

Block 2800 represents obtaining a substrate 400, e.g., for homoepitaxial or heteroepitaxial growth. Example substrates include, but are not limited to, a gallium nitride substrate, an aluminum nitride substrate, a sapphire substrate, a silicon substrate, a spinel substrate, or a silicon carbide substrate. Example substrate orientations include, but are not limited to, a miscut or an orientation suitable for semipolar, polar (e.g., N-polar), or nonpolar III-nitride growth on the substrate.

Block 2802 represents optionally depositing a buffer layer 402 on the substrate.

Block 2804 represents optionally depositing a barrier layer 404 on the buffer layer. In one or more examples, the barrier layer comprises one or more materials having a higher conduction band energy as compared to the first material in the channel layer. In one or more examples, the barrier layer comprises one or more materials (e.g., III-nitride, e.g., including aluminum, e.g., AlGaN and/or AlN) having a higher conduction band energy as compared to gallium nitride in the channel layer. The barrier layer may be on or above the substrate and adjacent the first material in the channel layer formed in Block 2806.

Block 2806 represents depositing a channel layer 406 comprising a first material 408 on a second material 410. In one or more embodiments, the second material has a lower conduction band energy relative to the first material and/or the first and second materials comprise polar materials and a polarization of the second material provides a net positive polarization charge at an interface between the first material and the second material.

In one or more examples, the first material comprises gallium nitride and the second material comprises Ill-Nitride including indium and gallium (e.g., InGaN).

In one or more embodiments, the first material (e.g., gallium nitride) is a layer having a thickness in a range of 1-20 nm and the second material (e.g., comprising indium and gallium, e.g., InGaN) is a layer having a thickness in a range of 1-20 nm and an indium composition $x_{in}$ in the second material is in a range of 5%-20%. Examples include, but are not limited to, the channel layer having a thickness in a range of 8-15 nm and the second material comprising an InGaN layer having a thickness in a range of 15%-25% of the channel layer thickness and an indium composition in a range of 2%-8%. Further examples include, but are not limited to, the channel layer having a thickness in a range of 2-8 nm and the second material (e.g., an InGaN layer) having a thickness in a range of 15%-25% of the channel layer thickness and an indium composition in a range of 9%-20%. In one or more examples, the InGaN layer having a thickness of 15%-25% of the channel layer thickness has a thickness in a range of 1.5 nm-2.5 nm.

In one or more further embodiments, the step comprises selecting a thickness for each of the channel layer, the first material, and the second material, and selecting an indium content for the second material comprising indium, wherein the device formed in Block 2818 has a mobility (e.g., electron or hole mobility) increased by a factor of at least two as compared to the channel consisting essentially of gallium nitride. The step may comprise increasing an indium content (e.g., above 10%) in the second material as a thickness of the channel is decreased (e.g., below 8 nm).

In one or more examples, the channel layer comprises a 2DEG or two dimensional hole gas confined in the first material by the barrier formed in Block 2808 and/or Block 2804.

Block 2808 represents depositing a barrier layer 412 adjacent the second material, the barrier layer comprising one or more materials having higher conduction band energy as compared to the first material in the channel. In one or more examples, the barrier layer comprises a III-Nitride barrier layer including aluminum (e.g., AlGaN). In one or more embodiments, the barrier layer 412 is a cap layer.

Block 2810 represents optionally depositing a cap or other layer 1602 (e.g., a III-nitride cap layer such as GaN) on or above the barrier layer 412. In one or more embodiments, the layer is a $n^+$-type gallium nitride (GaN) layer on the cap layer/barrier outside the recess, wherein the in situ $n^+$-type GaN layer is grown in situ with the barrier layer, the cap layer, and the channel layer.

Block 2812 represents optionally forming a recess or opening 1300, 1800 in the cap layer.

Block 2814 represents depositing a dielectric 414 (e.g., silicon nitride) on or above the cap layer and/or the barrier layer formed in Block 2808, so that the dielectric 414 is between the gate electrode and the channel layer and the cap layer is between the dielectric and the gate electrode deposited in Block 2816. In one or more embodiments, the dielectric in the recess 1800 includes one or more layers grown by plasma enhanced chemical vapor deposition (PECVD), metal organic chemical vapor deposition (MOCVD), or atomic layer deposition, e.g., as illustrated and described in reference to FIGS. 18-27. In one or more embodiments, at least a portion of the dielectric outside the recess is removed and the dielectric aligns the T-gate in the recess, also as illustrated and described in reference to FIGS. 18-27.

In one or more embodiments, one or more or all of the layers deposited in Blocks 2800-2814 can be deposited using MOCVD.

Block 2816 represents depositing electrodes. The step comprises depositing gate electrode 416 on the dielectric 414. In one or more embodiments, the gate electrode is deposited in the recess 1300 and comprises a T-gate 1302 overhanging the dielectric 1604, 1304 without physically contacting the dielectric 1304, 1604.

Further processing steps may be performed, e.g., deposition of source (S) and drain (D) ohmic contacts to the channel layer. In one or more embodiments, a source contact and a drain ohmic contact are made to the in situ $n^+$-type GaN layer.

Figure 16A:
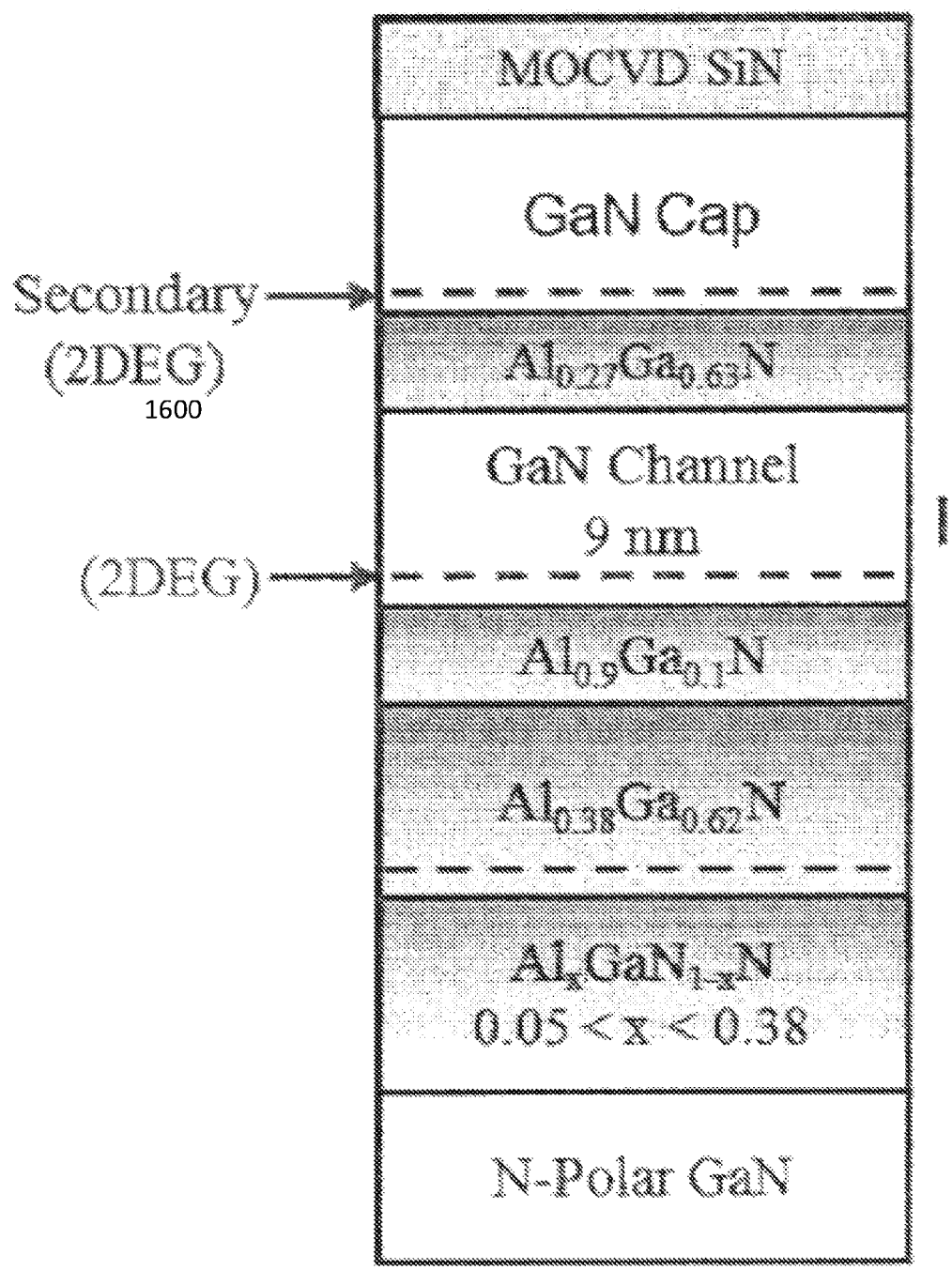
FIG. 16A illustrates a cross-section of a conventional NPDR epitaxial structure in the GaN cap access region and having a 9 run GaN channel and 47 nm GaN Cap. This NPDR contains a secondary 2DEG at the GaN Cap/AlGaN cap interface which does not contribute to conduction current (that portion of the electron concentration is not included in the displayed $n_s$).
Figure 16B:
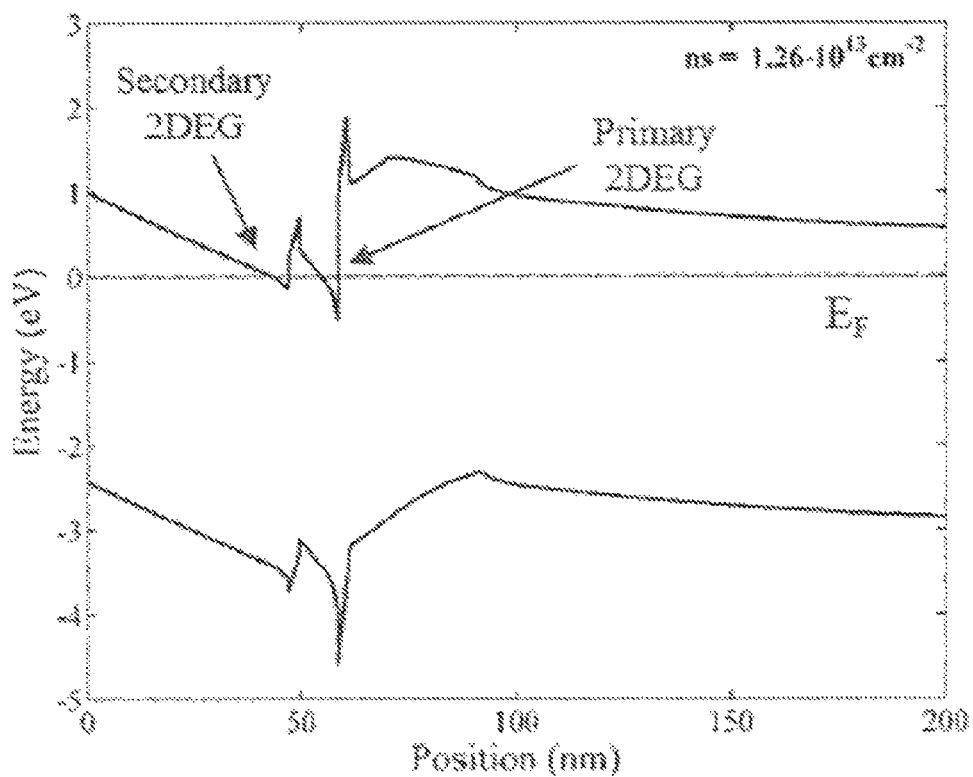
FIG. 16B is corresponding band diagram for the structure of FIG. 16A.
Figure 16C:
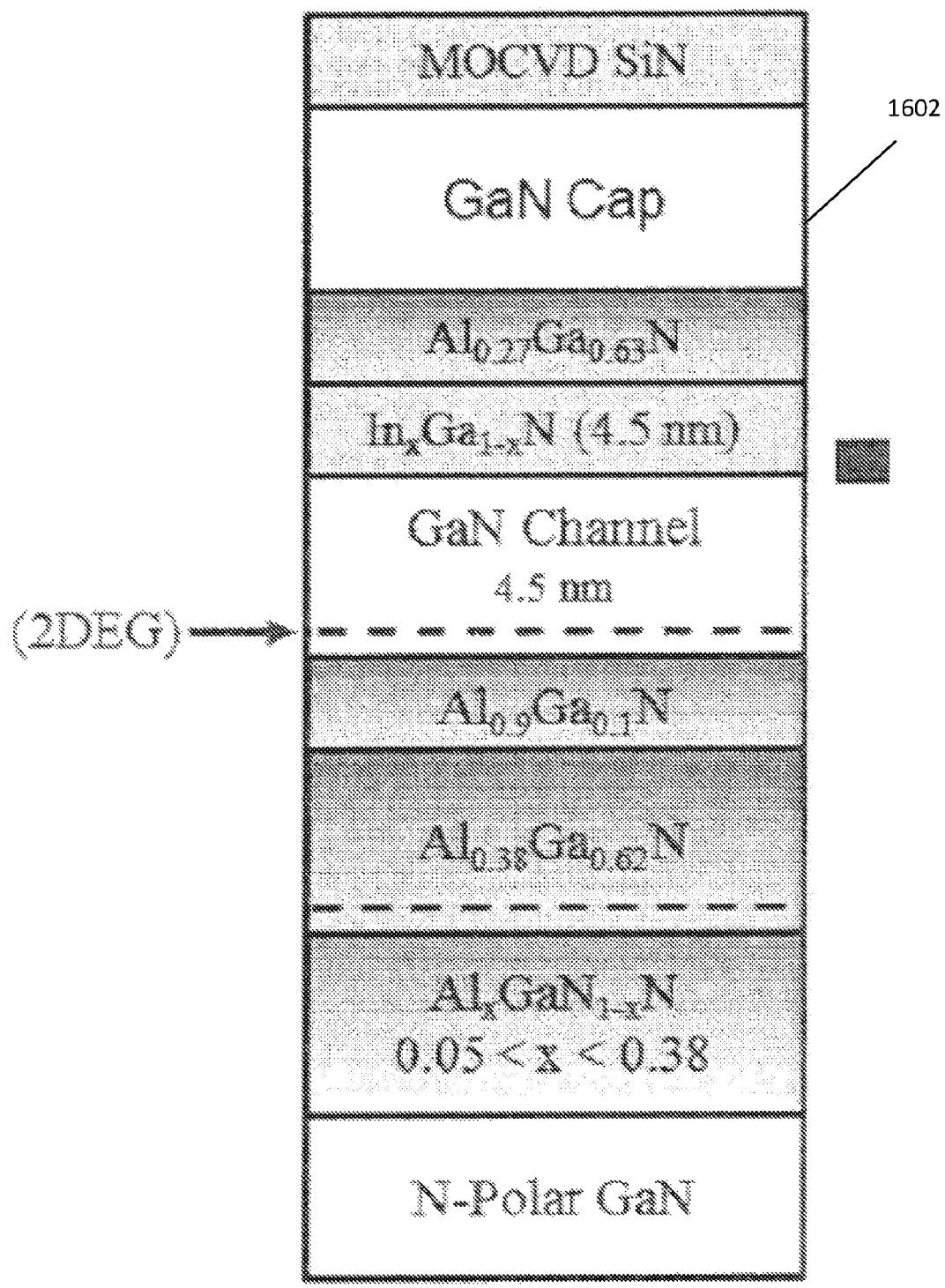
FIG. 16C depicts a novel field shaped NPDR MISHEMT according to embodiments of the present invention with a 9 nm channel (4.5 nm GaN/4.5 nm $In_{0.10}Ga_{0.90}N$) and a 47 nm GaN Cap. It can be seen that the secondary 2DEG of FIG. 16A has been removed and the charge has been transferred to the channel 2DEG, increasing the $n_s$ as compared to in FIG. 16A.
Figure 16D:
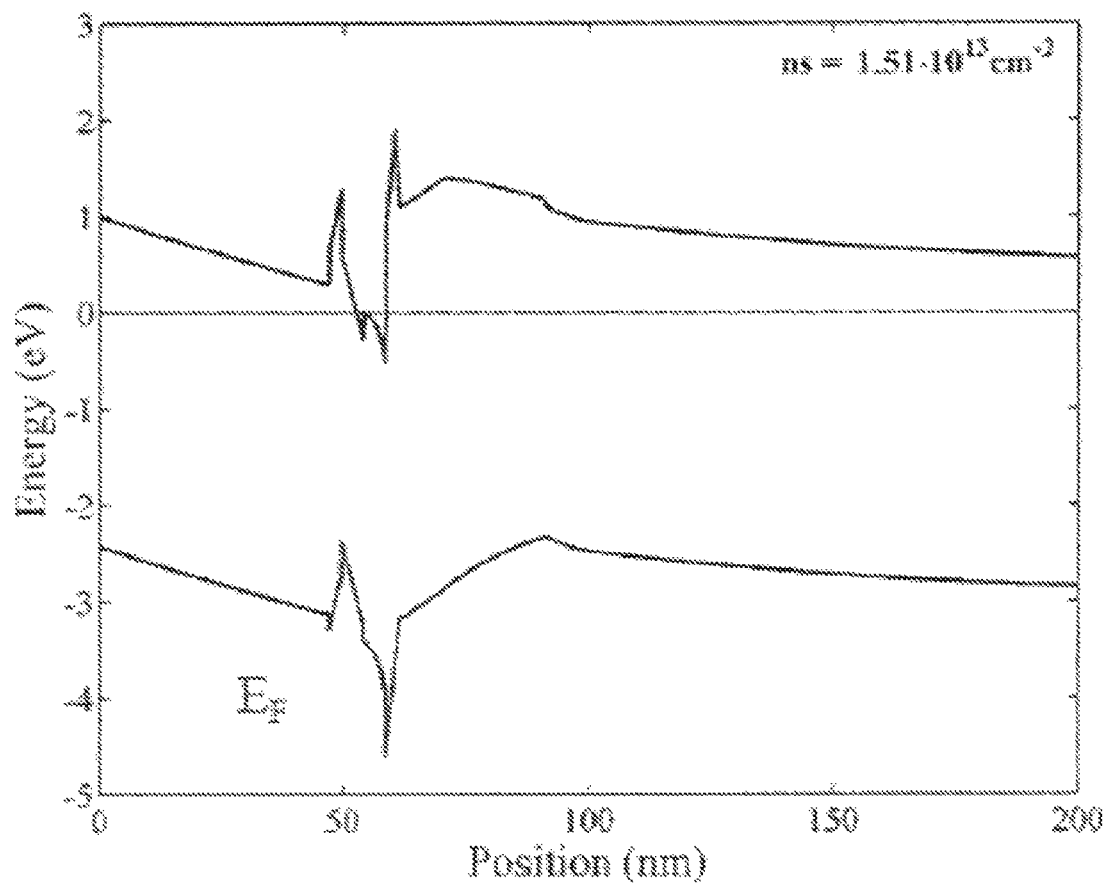
FIG. 16D illustrates the band diagram for the structure of FIG. 16C.

Block 2818 represents the end result, a device such as a HEMT, comprising a channel layer 406 including a first material 408 on/contacting/adjacent a second material 410; and a barrier layer 404, 412 on the channel layer 406 and comprising a higher conduction band energy as compared to the first material 408. In one or more examples, the channel layer 406 is between a first barrier layer 404 and a second barrier layer 412, e.g., as illustrated in FIG. 4B, 15C, or 16C.

In one or more further embodiments, the composite channel enables fabrication of N-polar HEMTs with in situ $n^+$ GaN ohmic contact. Such device structures and self-aligned processes for fabricating the devices are described herein, e.g., as illustrated in FIGS. 18-27.

In one or more examples, compared to traditional N-polar HEMTs that have pure GaN channels, the composite InGaN/GaN channel structure (channel with InGaN insertion layer) results in a surprisingly and unexpectedly significant increase of electron mobility and sheet charge density at small channel thicknesses. This enables the fabrication of devices with increased high frequency power performance and/or better vertical and lateral scaling of the transistor devices.

Similarly, a composite channel increases the mobility of holes in p-FETs.

In one or more further examples, the device is an N-polar MISHEMT, e.g., having improved high frequency high power performance (e.g., at 94 gigahertz (GHz)).

In yet another embodiment, a device structure for a high hole mobility transistor comprises a barrier layer 404 with a higher bandgap compared to a channel layer 406 on top of the higher/wider bandgap barrier layer 404, wherein the bandgap of the part 408 of the channel layer 406 adjacent to the barrier layer 404 is higher compared to a part 410 of the channel layer 406 away from the barrier layer 404 with both parts 408, 410 of the channel layer 406 having a bandgap less than the bandgap of the barrier layer 404.

Advantages and Improvements

In N-polar HEMTs the charge inducing layer is positioned below the channel 2DEG (FIGS. 4A and 4B), rather than between the channel 2DEG and gate metal, such as in Ga-polar structures. As a result, this layer can be modified to increase charge density independent of gate-to-channel distance, significantly improving the scalability of N-polar devices relative to Ga-polar transistors. However, as the channel thickness ($t_{ch}$) decreases, the electric field in the channel increases, the sheet charge density ($n_s$) in the channel decreases and the centroid of the 2DEG moves closer to the back-barrier/channel interface, resulting in a sharp decrease of the electron mobility ($\mu$) in HEMTs structures with ultra-scaled channels.[11] Considering that the alloy scattering is suppressed by the AlN interlayer between the AlGaN back-barrier and GaN channel, a hypothesis of the present disclosure is that the scattering at the AlN/GaN interface is the major reason for the mobility drop with decreasing $t_{ch}$. In a recent report, Ahmadi et al. attributed this mobility drop to an increase in charged interface states (CIS) scattering, which worsens as the 2DEG wavefunction moves closer to the AlN/GaN interface and as the $n_s$ of the 2DEG reduces due to less screening.[12]

One approach previously reported to achieve high conductivity in N-polar ultra-thin channel HEMTs was to insert an InAlN layer into the conventional AlGaN back-barrier, thereby increasing $n_s$ to achieve a better screening of the scattering centers and hence mitigate the mobility degradation as $t_{ch}$ decreased.[13] The present disclosure reports on an alternative route to enhance the electron mobility in scaled channels, by placing a thin InGaN layer in between the GaN channel and the AlGaN cap of the conventional N-polar AlGaN/GaN HEMT structure (FIG. 4B). The net positive polarization charge at the GaN/InGaN interface increases $n_s$ and reduces the electric field in the channel, resulting in an increase in the distance between the centroid of the 2DEG and the AlN/GaN interface ($d_{2DEG}$) and reducing the scattering at the interface and therefore improving the 2DEG mobility.

The present disclosure further reports on extending the performance of NPDR MISHEMTs. NPDR MISHEMTs have recently demonstrated record performance for W-band power amplification. In one or more embodiments, the design of the channel layer described herein reduces the vertical electric field, improves the electron mobility, and increases the 2DEG charge density in the NPDR MISHEMT. Enhanced electrostatic control can be pursued by further vertical and lateral scaling of the transistors through exploration of the design space and optimization of established growth and fabrication processes. All benefits may result in an improved device performance in the W-band (e.g., at 94 GHz).

In one or more embodiments, the InGaN insertion layer between the GaN channel and AlGaN cap results in the following effects.
(1) A significant reduction of the electric field in the GaN channel which in turn leads to higher electron mobilities for a given channel thickness. The polarization fields in the inserted InGaN layer cause an additional voltage drop across the InGaN region, pushing the conduction band of the GaN channel further below the Fermi level, resulting in an enhancement of the sheet charge (FIG. 15D).
(2) An increase of the reverse electric field in the 2.6 nm thick $Al_{0.27}Ga_{0.73}N$ cap under the gate, increasing the breakdown voltage of the device.
(3) Relaxation of the electric field sufficient to raise the composition of the AlGaN cap layer above 27% so as to reduce the gate leakage/increase the breakdown voltage.
(4) In the access regions, removal of the secondary 2DEG 1600 observed at the AlGaN cap/GaN cap interface in previous NPDR MISHEMTs (FIG. 16A, 16B). The charge from the secondary 2DEG is transferred to the GaN channel 2DEG, greatly enhancing the conductivity in the access regions of the device.

Possible Modifications and Variations

In one or more embodiments, as the channel is scaled vertically it may be desirable to increase the indium (In) concentration to minimize alloy scattering by keeping most of the 2DEG wave function in the binary GaN portion of the channel. The growth temperature is typically reduced when increasing the In concentration. This may require the optimization of the deposition conditions for the AlGaN cap and GaN cap epitaxial layers at lower temperatures, so as to prevent thermal decomposition of the underlying $In_xGa_{1-x}N$ layer, whose thermal stability is lower than that of typical (Al,Ga)N films, and ensure that impurity incorporation is minimized. Additionally, optimization of the $In_zGa_{1-x}N$ deposition process will be considered to reduce lateral variations in the alloy composition, with the intent of preventing alloy scattering of the channel 2DEG.

In one or more embodiments, the following optimizations of the epitaxial growth process are performed to target high performance HEMT devices:
  optimization of the $In_zGa_{1-x}N$ deposition process to reduce lateral variations in the alloy composition, with the intent of preventing alloy scattering of the channel 2DEG;
  optimization of the AlGaN etch stop and GaN cap epitaxial growth process at lower temperatures. This is to prevent thermal decomposition of the underlying $In_xGa_{1-x}N$ layer, whose thermal stability is lower than that of typical (Al,Ga)N films;
  optimization of the thickness and composition of the graded InGaN layer and the GaN channel for optimum device performance. Samples with different graded InGaN layer thicknesses, $In_xGa_{1-x}N$ compositions, and GaN channel layer thicknesses may be grown, processed and tested; and/or
  replacing the InGaN layer by AlGaInN layers with a band gap lower than GaN, reducing the lattice mismatch and potentially In clustering further increasing the electron mobility;

all binary and ternary materials in the structure can be replaced by quarternary (Al,Ga,In)N or (B,Al,Ga,In)N layers optimization for direct current (DC) or radio frequency (RF) performance (e.g., at 10-94 GHz. Optimization may be performed by evaluating device performance under different growth conditions/structure compositions using by DC-IV, small signal RF, and breakdown voltage measurements. Potential dispersion in the devices can be examined by conducting pulsed IV measurements with a pulse width down to 200 ns. The output power of the devices can be determined by load-pull measurement from 10-94 GHz. For the evaluation of material, characterization techniques may include SIMS, X-ray, AFM, TEM, Hall, C-V and TLM measurements.

In one or more further embodiments, the composite channel enables fabrication of N-polar HEMTs with in situ n+ GaN ohmic contact. Such device structures and self-aligned processes for fabricating the devices are described herein, e.g., as illustrated in FIGS. 18-27.

Nomenclature

The term "III-nitrides" refers to any alloy composition of the (Ga,Al,In,B)N semiconductors having the formula $Ga_wAl_xIn_yB_zN$ where $0 \leq w \leq 1$, $0 \leq x \leq 1$, $0 \leq y \leq 1$, $0 \leq z \leq 1$, and $w+x+y+z=1$.

Spontaneous and piezoelectric polarization effects in GaN or III-nitride based devices are eliminated by growth of the device on nonpolar planes of the crystal. Such planes contain equal numbers of Ga (or group III atoms) and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes. Thus, nonpolar III-nitride is grown along a direction perpendicular to the (0001) c-axis of the III-nitride crystal.

Another approach to reducing polarization effects in (Ga, Al,In,B)N devices is to grow the devices on semi-polar planes of the crystal to form semipolar device layers. The term "semi-polar plane" (also referred to as "semipolar plane") can be used to refer to any plane that cannot be classified as c-plane, a-plane, or m-plane. In crystallographic terms, a semi-polar plane may include any plane that has at least two nonzero h, i, or k Miller indices and a nonzero I Miller index.

Polar c-plane devices can also be fabricated. A composite InGaN/GaN structure on a c AlGaN layer can result in an increase in the hole mobility if the hole two dimensional gas is at the AlGaN/GaN interface. The Gallium or Ga face of GaN is the $c^+$ or (0001) plane, and the Nitrogen or N-face of GaN or a III-nitride layer is the $c^-$ or (000-1) plane.

REFERENCES

The following references are incorporated by reference herein.

[1] Ambacher O, Smart J, Shealy J R, Weimann N G, Chu K, Murphy M, Schaff W J, and Eastman L F, Dimitrov, R, Wittmer L, Stutzmann M, Rieger W and Hilsenbeck J, *J. Appl. Phys.* 85, 3222 (1999).

[2] Bernardini F, Fiorentini V and Vanderbilt D, *Phys. Rev. B* 56, R10024(1997)

[3] Keller S, Li H, Laurent M, Hu Y, Pfaff N, Lu J, Brown D F, Fichtenbaum N A, Speck J S, DenBaars S P and Mishra U K, *Semicond. Sci. Technol.* 29, 113001 (2014).

[4] Wong M H, Keller S, Nidhi, Dasgupta S, Denninghoff D J. Kolluri S, Brown D F, Lu J, Fichtenbaum N A, Ahmadi E, Singisetti U, Chini A, Rajan S, DenBaars S P, Speck J S and Mishra U K, *Semicond. Sci. Technol.* 28, 074009 (2013).

[5] Denninghoff D, Lu J, Ahmadi E, Keller S and Mishra U K, in *Device Research Conference (DRC)*, 2013 71st Annual, Notre Dame, USA, 23-26 Jun. 2013, pp. 197-198.

[6] Wong M H, Pei Y, Palacios T, Shen L, Chakraborty A, McCarthy L S, Keller S, DenBaars S P, Speck J S, and Mishra U K, *Appl. Phys. Lett.* 91, 232103 (2007).

[7] Nidhi, Brown D F, Keller S, and Mishra U K, *Jpn. J. Appl. Phys.* 49, 021005 (2010).

[8] Wienecke S, Romanczyk B, Guidry M, Li H, Ahmadi E, Hestroffer K, Zheng X, Keller S, and Mishra U K, *IEEE Electron Device Lett.* 38 359 (2017).

[9] Romanczyk B, Guidry M, Wienecke S, Li H, Ahmadi E, Zheng X, Keller S, and Mishra U K, in *Electron Devices Meeting (IEDM)*, 2016 IEEE International, San Francisco, USA, 3-7 Dec. 2016, pp. 67-70.

[10] Zheng X, Guidry M, Li H, Ahmadi E, Hestroffer K, Romanczyk B, Wienecke S, Keller S and Mishra U K, *IEEE Electron Device Lett.* 37, 77 (2016).

[11] Singisetti U, Wong M H, and Mishra U K, *Appl. Phys. Lett.* 101, 012101 (2012).

[12] Ahmadi E, Keller S, Mishra U K, *J. Appl. Phys.* 120, 115302 (2016).

[13] Lu J, Denninghoff D, Yeluri R, Lal S, Gupta G, Laurent M, Keller S, DenBaars S P and Mishra U K, *J. Appl. Phys.* 102, 232104 (2013).

[14] Keller S, Fichtenbaum N A, Wu F, Brown D, Rosales A, Denbaars S P, Spect J S and Mishra U K, *J. Appl. Phys.* 102, 083546 (2007).

[15] Keller S, Suh C S, Chen Z, Chu R, Rajan S, Fichtenbaum N A, Furukawa M, DenBaars S P, Speck J S, and Mishra U K, *J. Appl. Phys.* 103, 033708 (2008).

[16] Brown D F, Chu R, Keller S, DenBaars S P and Mishra U K, *Appl. Phys. Lett.* 94, 153506 (2009).

[17] Grundmann M, BANDENG (http://my.ece.ucsb.edu/mgrundmann/bandeng).

[18] Keller S, Suh C S, Fichtenbaum N A, Furukawa M, Chu R, Chen Z, Vijayraghavan K, Rajan S, DenBaars S P, Speck J S, and Mishra U K, *J. Appl. Phys.* 104, 093510 (2008).

[19] Ahmadi E, Chalabi H, Kaun S W, Shivaraman R, Speck J S, and Mishra U K, *J. Appl. Phys.* 116, 133702 (2014).

[20] Elaheh Ahmadhi, PhD Thesis, University of Califomia Santa Barbara, 2015.

[21] M. Gladysiewicz, R. Kudrawiec, J. Misiewicz, G. Cvwinski, M. Siekacz, P. Wolny, and C. Skierbiszewski, *Appl. Phys. Lett.* 98, 231902 (2011).

[22] R. Stratton, *J. Phys. Chem.* Solids 23, 1177 (1962).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A device structure for a field effect transistor (FET) device, comprising:

an N-polar structure having an N-polar orientation, comprising:
a channel layer comprising a first material and a second material, wherein:
  (1) the second material has a lower conduction band energy relative to the first material, or
  (2) the first and second materials comprise polar materials and a polarization of the second material provides a net positive polarization charge at an interface between the first material and the second material, or
  (3) the second material has a lower conduction band energy relative to the first material, the first and second materials comprise polar materials, and a polarization of the second material provides a net positive polarization charge at an interface between the first material and the second material; and
a first barrier layer on the channel layer and comprising a higher conduction band energy as compared to the first material, wherein the second material is between the first barrier layer and the first material; and
a charge supplying barrier layer below the channel layer so that the channel layer is between the first barrier and the charge supplying barrier layer, the charge supplying barrier layer supplying charge to the channel layer.

2. The device of claim 1, wherein:
the first material comprises gallium nitride and the second material comprises III-Nitride including indium and gallium; and
the first barrier layer comprises a III-Nitride barrier layer including aluminum.

3. The device of claim 2, wherein:
the charge supplying barrier layer comprises III-nitride having a higher conduction band energy as compared to the gallium nitride and is located below the channel layer.

4. The device of claim 3, wherein the charge supplying barrier layer below the channel layer comprises aluminum.

5. The device of claim 2, wherein the gallium nitride is a layer having a thickness in a range of 1-20 nm and the second material is a layer having a thickness in a range of 1-20 nm and an indium composition in a range of 5%-20%.

6. The device of claim 2, wherein:
the channel layer has a thickness in a range of 8-15 nm, and
the second material is an InGaN layer having:
a thickness in a range of 18%-25% of the channel layer thickness, and
an indium composition in a range of 2%-8%.

7. The device of claim 2, wherein:
the channel layer has a thickness in a range of 2-8 nm, and
the second material is an InGaN layer having:
a thickness in a range of 18%-25% of the channel layer thickness, and
an indium composition in a range of 9%-20%.

8. The device of claim 2, wherein:
the channel layer, the first material, and the second material each have a thickness, and
the second material comprises InGaN having an indium composition,
such that the device has a mobility increased by a factor of at least two as compared to the device comprising a channel layer consisting essentially of gallium nitride.

9. The device of claim 2, further comprising:
a gate electrode; and
a dielectric between the gate electrode and the channel layer, wherein the channel layer comprises a two dimensional electron or hole gas confined in the first material by the first barrier layer,
the two dimensional electron or hole gas forms on top of the charge supplying barrier layer,
the two dimensional electron or hole gas is located in the first material composed of GaN, and
the first material has a larger band gap compared to the second material composed of InGaN.

10. The device of claim 9, further comprising:
a III-nitride cap layer on or above the channel layer, wherein the cap layer is between the channel layer and the dielectric, and
a recess in the cap layer, wherein the gate electrode is deposited in the recess and comprises a T-gate overhanging a portion of the dielectric without physically contacting the portion of the dielectric.

11. The device of claim 10, further comprising:
an in situ $n^+$-type gallium nitride (GaN) layer on the cap layer outside the recess, wherein the in situ $n^+$-type GaN layer is grown in situ with the barrier layer and the channel layer, and the cap layer comprises AlGaN;
a source contact and a drain contact to the in situ $n^+$-type GaN layer; and wherein:
the dielectric in the recess includes one or more layers grown by plasma enhanced chemical vapor deposition (PECVD), metal organic chemical vapor deposition (MOCVD), or atomic layer deposition, and
at least a portion of the dielectric outside the recess is removed and the dielectric aligns the T-gate in the recess.

12. A method for fabricating a device structure for a field effect transistor (FET), comprising:
depositing an N-polar structure, comprising:
depositing a charge supplying barrier layer;
depositing, on the charge supplying barrier layer, a channel layer comprising a first material and a second material, wherein:
  (1) the second material has a lower conduction band energy relative to the first material, or
  (2) the first and second materials comprise polar materials and a polarization of the second material provides a net positive polarization charge at an interface between the first material and the second material, or
  (3) the second material has a lower conduction band energy relative to the first material, the first and second materials comprise polar materials, and a polarization of the second material provides a net positive polarization charge at an interface between the first material and the second material; and
forming a first barrier layer on the channel layer, the first barrier layer comprising a higher conduction band energy as compared to the first material, wherein:
the second material is between the first barrier layer and the first material and
the charge supplying barrier layer supplies charge to the channel layer.

13. The method of claim 12, wherein:
the first material comprises gallium nitride and the second material comprises III-Nitride including indium and gallium; and
the first barrier layer comprises III-Nitride barrier including aluminum.

14. The method of claim 13, wherein:
the charge supplying barrier layer comprises III-nitride having a higher conduction band energy as compared to the gallium nitride.

15. The method of claim 13, wherein:
the gallium nitride is a layer having a thickness in a range of 1-20 nm,
the second material is a layer having a thickness in a range of 1-20 nm and an indium composition in a range of 5%-20%,
and the channel layer and the barrier layer have an N-polar orientation.

16. The method of claim 13, wherein:
the channel layer has a thickness in a range of 8-15 nm, and
the second material is an InGaN layer having:
a thickness in a range of 18%-25% of the channel layer thickness, and
an indium composition in a range of 2%-8%.

17. The method of claim 13, wherein:
the channel layer has a thickness in a range of 4-8 nm, and
the second material is an InGaN layer having:
a thickness in a range of 18%-25% of the channel layer thickness, and
an indium composition in a range of 9%-20%.

18. The method of claim 13, further comprising:
selecting a thickness for each of the channel layer, the first material, and the second material; and
selecting an indium content for the second material comprising Indium,
wherein the device has a mobility increased by a factor of at least two as compared to the device comprising a channel consisting essentially of gallium nitride.

19. The method of claim 13, further comprising increasing an indium content in the second material as a thickness of the channel is decreased.

20. The method of claim 13, further comprising:
depositing a III-nitride cap layer on or above the channel layer;
forming a recess in the cap layer;
depositing a dielectric on or above the cap layer; and
depositing a gate electrode, wherein:
the gate electrode is deposited in the recess and comprises a T-gate overhanging a portion of the dielectric without physically contacting the portion of the dielectric, and
the channel layer and the first barrier layer have an N-polar orientation and the channel layer comprises a two dimensional electron or hole gas confined in the first material.

21. The method of claim 20, further comprising:
depositing an in situ $n^+$-type gallium nitride (GaN) layer on the cap layer outside the recess, wherein the in situ $n^+$-type GaN layer is grown in situ with the barrier layer and the channel layer, and the cap layer comprises AlGaN;
forming a source contact and a drain contact to the in situ $n^+$-type GaN layer; and wherein:
the dielectric in the recess includes one or more layers grown by plasma enhanced chemical vapor deposition (PECVD), metal organic chemical vapor deposition (MOCVD), or atomic layer deposition, and
at least a portion of the dielectric outside the recess is removed and the dielectric aligns the T-gate in the recess.

22. A device structure for a high hole mobility transistor, comprising:
an N-polar structure including a channel layer on top of a barrier layer, the barrier layer having a higher bandgap compared to the channel layer, wherein:
the bandgap of the channel layer adjacent to the barrier layer is higher compared to a part of the channel layer away from the barrier layer with both parts of the channel layer having a bandgap less than the bandgap of the barrier layer, and
the barrier layer supplies charge to the channel layer.

23. The method of claim 12, further comprising:
depositing a III-nitride cap layer on or above the channel layer;
depositing a dielectric so that the cap layer is between the channel layer and the dielectric;
forming a recess in the cap layer; and
depositing a gate electrode in the recess, wherein the gate electrode comprises a T-gate overhanging a portion of the dielectric without physically contacting the portion of the dielectric; and wherein the channel layer comprises a two dimensional electron or hole gas confined in the first material by the first barrier layer.

* * * * *